United States Patent
Inoue et al.

(10) Patent No.: US 11,414,321 B2
(45) Date of Patent: Aug. 16, 2022

(54) CARBON NANOTUBE COMPOSITE MATERIAL AND METHOD FOR PRODUCING CARBON NANOTUBE COMPOSITE MATERIAL

(71) Applicant: HITACHI ZOSEN CORPORATION, Osaka (JP)

(72) Inventors: Tetsuya Inoue, Osaka (JP); Hiroyuki Maruyama, Osaka (JP); Yoko Kawakami, Osaka (JP)

(73) Assignee: HITACHI ZOSEN CORPORATION, Osaka (JP)

( * ) Notice: Subject to any disclaimer, the term of this patent is extended or adjusted under 35 U.S.C. 154(b) by 72 days.

(21) Appl. No.: 17/064,277

(22) Filed: Oct. 6, 2020

(65) Prior Publication Data

US 2021/0032100 A1 Feb. 4, 2021

Related U.S. Application Data

(62) Division of application No. 16/066,153, filed as application No. PCT/JP2016/089031 on Dec. 28, 2016, now Pat. No. 10,836,633.

(30) Foreign Application Priority Data

Dec. 28, 2015 (JP) ................. 2015-256720

(51) Int. Cl.
*B82Y 40/00* (2011.01)
*C09K 5/14* (2006.01)
(Continued)

(52) U.S. Cl.
CPC ............... *B82Y 40/00* (2013.01); *B82Y 30/00* (2013.01); *C01B 32/158* (2017.08); *C09K 5/14* (2013.01);
(Continued)

(58) Field of Classification Search
CPC ....... B82Y 30/00; B82Y 40/00; C01B 32/158; H01B 1/04; H01L 23/373; H01L 23/3736;
(Continued)

(56) References Cited

U.S. PATENT DOCUMENTS 8,093,715 B2 * 1/2012 Xu .................. H01L 23/373
257/E23.101
9,095,821 B1 8/2015 Ratto
(Continued)

FOREIGN PATENT DOCUMENTS

CN 1893040 A 1/2007
CN 1897205 A 1/2007
(Continued)

OTHER PUBLICATIONS

Notice of Allowance dated Apr. 1, 2020 issued in corresponding U.S. Appl. No. 16/066,153.
(Continued)

*Primary Examiner* — Tri V Nguyen
(74) *Attorney, Agent, or Firm* — Pillsbury Winthrop Shaw Pittman, LLP

(57) ABSTRACT

A carbon nanotube composite material includes a fixture sheet having a front side and a back side, and a carbon nanotube array sheet embedded in or bonded to both front and back sides of the fixture sheet.

1 Claim, 17 Drawing Sheets

(51) Int. Cl.
  *H01L 23/373* (2006.01)
  *H05K 7/20* (2006.01)
  *H01L 23/42* (2006.01)
  *C01B 32/158* (2017.01)
  *B82Y 30/00* (2011.01)
  *H01B 1/04* (2006.01)

(52) U.S. Cl.
  CPC .............. *H01B 1/04* (2013.01); *H01L 23/373* (2013.01); *H01L 23/3736* (2013.01); *H01L 23/3737* (2013.01); *H01L 23/42* (2013.01); *H05K 7/20* (2013.01)

(58) Field of Classification Search
  CPC . H01L 23/3737; H01L 23/42; H01L 23/3672; H05K 7/20; H05K 7/2039; C09J 127/12
  USPC ........ 252/500, 502, 506, 510; 977/742, 753, 977/789; 423/445 R, 448, 460
  See application file for complete search history.

(56) References Cited

U.S. PATENT DOCUMENTS

| | | |
|---|---|---|
| 2005/0116336 A1 | 6/2005 | Chopra et al. |
| 2007/0004081 A1 | 1/2007 | Hsiao |
| 2007/0013287 A1 | 1/2007 | Huang et al. |
| 2007/0298253 A1 | 12/2007 | Hata |
| 2008/0083612 A1 | 4/2008 | Wang et al. |
| 2008/0292840 A1 | 11/2008 | Majumdar |
| 2010/0051331 A1 | 3/2010 | Tsai |
| 2010/0200208 A1 | 8/2010 | Cola |
| 2010/0301260 A1 | 12/2010 | Dai et al. |
| 2012/0208002 A1 | 8/2012 | Todd et al. |
| 2014/0015158 A1 | 1/2014 | Cola |
| 2014/0034282 A1 | 2/2014 | Kawamura et al. |
| 2014/0102687 A1 | 4/2014 | Dai et al. |
| 2015/0136360 A1 | 5/2015 | Xu et al. |
| 2015/0209761 A1 | 7/2015 | Cola |
| 2015/0291427 A1 | 10/2015 | Wei et al. |
| 2015/0291428 A1 | 10/2015 | Wei et al. |
| 2016/0104655 A1 | 4/2016 | Kawabata |
| 2016/0145105 A1 | 5/2016 | Inoue et al. |

FOREIGN PATENT DOCUMENTS

| | | | |
|---|---|---|---|
| CN | 101073934 A | 11/2007 | |
| CN | 101899288 A | 12/2010 | |
| CN | 104520232 A | 4/2015 | |
| CN | 104973583 A | 10/2015 | |
| CN | 104973584 A | 10/2015 | |
| CN | 105164049 A | 12/2015 | |
| EP | 2462613 | 6/2012 | |
| EP | 2546871 A1 | 1/2013 | |
| EP | 2863426 | 4/2015 | |
| JP | 2004-338982 | 12/2004 | |
| JP | 2009-4756 | 1/2009 | |
| JP | 2011-096832 | 5/2011 | |
| JP | 2012-224507 | 11/2012 | |
| JP | 2014003144 A * | 1/2014 | ... H01L 2224/16225 |
| JP | 2014-33104 | 2/2014 | |
| JP | 2014-60252 | 4/2014 | |
| JP | 2014-227331 | 12/2014 | |
| JP | 2015-98418 | 5/2015 | |
| JP | 2015-526904 | 9/2015 | |
| WO | 2005/028549 A2 | 3/2005 | |
| WO | 2014/203547 | 12/2014 | |

OTHER PUBLICATIONS

Final Office Action dated Dec. 20, 2019 issued in corresponding U.S. Appl. No. 16/066,153.
Non-final Office Action dated Sep. 13, 2019 issued in corresponding U.S. Appl. No. 16/066,153.
Extended European Search Report dated Jul. 12, 2019 issued in corresponding EP Application No. 16881806.0.
International Search Report PCT/JP2016/089031 dated Feb. 7, 2017 with English translation.
International Preliminary Report on Patentability PCT/JP2016/089031 dated Jul. 3, 2018 with English translation.
Non-final Office Action dated May 29, 2019 issued in corresponding U.S. Appl. No. 16/066,153.

* cited by examiner

CARBON NANOTUBE COMPOSITE MATERIAL AND METHOD FOR PRODUCING CARBON NANOTUBE COMPOSITE MATERIAL

CROSS-REFERENCE TO RELATED APPLICATIONS

This application is a Divisional Application of U.S. Ser. No. 16/066,153, filed on Jun. 28, 2018, which is the U.S. National Stage of PCT/JP2016/089031, filed Dec. 28, 2016, which in turn claims priority to Japanese Patent Application No. 2015-256720, filed Dec. 28, 2015, the contents of each of these applications being incorporated herein by reference in their entireties.

TECHNICAL FIELD

The present invention relates to a carbon nanotube composite material and a method for producing a carbon nanotube composite material.

BACKGROUND ART

There has been known that a thermal conductive material (Thermal Interface Material: hereinafter referred to as TIM) is disposed between an electronic component and a heat sink to reduce the gap between the electronic component and the heat sink to efficiently conduct heat generated from the electronic component to the heat sink. For such a TIM, a polymer sheet composed of a polymer material and a silicone grease has been known.

However, the polymer sheet cannot sufficiently conform to subtle bumps and dents (surface roughness) on the surfaces of the electronic component and heat sink, and the subtle bumps and dents may cause gaps between the electronic component and the heat sink, and there are limitations as to improvement in thermal conductivity.

The silicone grease can conform to the subtle bumps and dents on the surfaces of the electronic component and heat sink, but repetitive changes in temperature may cause pumping out (discharge from between the electronic component and heat sink), and it is difficult to secure the thermal conductivity of the TIM for a long period of time.

Thus, a TIM that is capable of conforming to the subtle bumps and dents on the surfaces of the electronic component and heat sink and capable of securing thermal conductivity for a long period of time has been desired, and use of carbon nanotube (hereinafter referred to as CNT) for TIM has been examined.

For example, Patent Document 1 has proposed a thermal interface pad including a substrate and CNT arranged in array on both sides of the substrate (for example, see Patent Document 1).

Such a thermal interface pad is produced by allowing CNT to grow on both surfaces of the substrate by chemical vapor deposition. In such a thermal interface pad, CNT is disposed on both sides of the substrate, and therefore the CNT can be allowed to conform to the subtle bumps and dents on the surface of the electronic component and heat sink.

CITATION LIST

Patent Document

Patent document 1: WO2015-526904

SUMMARY OF THE INVENTION

Problem to be Solved by the Invention

The thermal interface pad described in patent document 1 is produced by allowing the CNT to grow on both sides of the substrate by chemical vapor deposition, and therefore adhesive strength between the substrate and CNT cannot be secured sufficiently. Therefore, when the thermal interface pad is used as TIM, CNT may be dropped off from the substrate. In this case, it is difficult to secure thermal conductivity of the thermal interface pad, and the dropped CNT may cause short circuit of electronic components.

Thus, a first object of the present invention is to provide a carbon nanotube composite material which is capable of conforming to subtle dents and bumps on the surface of an object, and suppressing dropping out of the carbon nanotube; and a method for producing a carbon nanotube composite material.

Means for Solving the Problem

<First Invention>

The present invention [1] includes a carbon nanotube composite material including a fixture sheet having a front side and a back side, and a carbon nanotube array sheet embedded in or bonded to both front and back sides of the fixture sheet.

With this configuration, the carbon nanotube composite material includes the carbon nanotube array sheet, and therefore when the carbon nanotube composite material is allowed to contact an object, a plurality of CNTs in the carbon nanotube array sheet are allowed to conform to the subtle dents and bumps of the object surface.

Furthermore, the carbon nanotube array sheet is embedded in or bonded to both front and back sides of the fixture sheet, and therefore the CNT in the carbon nanotube array sheet can be suppressed from dropping out from the fixture sheet.

The present invention [2] includes the carbon nanotube composite material of [1] above, wherein the carbon nanotube array sheet has an average bulk density of 50 mg/cm$^3$ or more.

With this configuration, the carbon nanotube array sheet has an average bulk density of the above-described lower limit or more, and therefore thermal conductivity of the carbon nanotube array sheet can be improved, and thermal conductivity of the carbon nanotube composite material can be improved.

However, when the carbon nanotube array is allowed to grow on both sides of the substrate by chemical vapor deposition, it is difficult to set the average bulk density of the carbon nanotube array to the above-described lower limit or more.

Meanwhile, with the above-described configuration, the carbon nanotube array sheet removed from the growth substrate is embedded in or bonded to the fixture sheet, and therefore the carbon nanotube array sheet can be densified after being removed from the growth substrate. Therefore, the average bulk density of the carbon nanotube array sheet can be set to the above-described lower limit or more.

The present invention [3] includes the carbon nanotube composite material of [1] or [2] above, wherein the fixture sheet includes a substrate, and a resin layer disposed on both front and back sides of the substrate, and the substrate-side end portion of the carbon nanotube array sheet is embedded in the corresponding resin layer to be in contact with the substrate.

With this configuration, the end portion of the carbon nanotube array sheet on the substrate side is embedded in the corresponding resin layer, and in contact with the substrate, and therefore the CNT in the carbon nanotube array sheet can be reliably suppressed from dropping out from the fixture sheet, and thermal conductivity of the carbon nanotube composite material can be reliably improved.

The present invention [4] includes the carbon nanotube composite material of [3] above, wherein the substrate is electroconductive.

With this configuration, the electroconductive carbon nanotube array sheet is in contact with the electroconductive substrate, and therefore electroconductivity can be given to the carbon nanotube composite material.

The present invention [5] includes the carbon nanotube composite material of [3] above, wherein the substrate is formed from a sintered inorganic material.

With this configuration, the carbon nanotube array sheet is in contact with the substrate formed from a sintered inorganic material, and therefore electrically non-conductive properties can be given to the carbon nanotube composite material.

The present invention [6] includes the carbon nanotube composite material of [1] or [2] above, wherein the fixture sheet includes a conductive layer having electroconductivity, and the conductive layer-side end portion of the carbon nanotube array sheet is bonded to the interface of the conductive layer.

With this configuration, the conductive layer-side end portion of the carbon nanotube array sheet is bonded to the conductive layer having electroconductivity, and therefore the CNT in the carbon nanotube array sheet can be reliably suppressed from dropping out from the fixture sheet, and thermal conductivity of the carbon nanotube composite material can be improved reliably, and electroconductivity can be given to the carbon nanotube composite material.

The present invention [7] includes the carbon nanotube composite material of [1] or [2] above, wherein the front-side carbon nanotube array sheet and the back-side carbon nanotube array sheet are embedded in the fixture sheet, and are in contact with each other in the fixture sheet.

With this configuration, the front-side carbon nanotube array sheet and the back-side carbon nanotube array sheet are embedded in the fixture sheet, and are in contact with each other in the fixture sheet, and therefore the carbon nanotube of the carbon nanotube array sheet can be reliably suppressed from dropping out from the fixture sheet, and thermal conductivity of the carbon nanotube composite material can be improved reliably.

The present invention [8] includes a method for producing a carbon nanotube composite material, the method including: preparing a fixture sheet including a substrate and a resin layer disposed on both front and back sides of the substrate, allowing vertically-aligned carbon nanotube to grow on a growth substrate, removing the vertically-aligned carbon nanotube from the growth substrate to form a carbon nanotube array sheet, disposing the carbon nanotube array sheet on both front and back sides of the resin layer, and heating the fixture sheet on which the carbon nanotube array sheet is disposed to embed the substrate-side end portion of the carbon nanotube array sheet to the corresponding resin layer, and to bring into contact with the substrate.

With such a method, the carbon nanotube array sheet removed from the growth substrate is disposed on the resin layer disposed on both sides of the substrate, and then heated to embed the substrate-side end portion of the carbon nanotube array sheet to the corresponding resin layer and to bring into contact with the substrate.

Therefore, a carbon nanotube composite material including the carbon nanotube array sheet embedded in the resin layer can be produced efficiently with an easy method.

The present invention [9] includes a method for producing a carbon nanotube composite material, the method including: applying a resin composition on both front and back sides of a substrate to form a resin composition layer on both front and back sides of the substrate; allowing vertically-aligned carbon nanotube to grow on a growth substrate; removing the vertically-aligned carbon nanotube from the growth substrate to form a carbon nanotube array sheet; embedding the carbon nanotube array sheet in both front and back sides of the resin composition layer to bring the substrate-side end portion of the carbon nanotube array sheet into contact with the substrate; and heating and curing the resin composition layer to form a resin layer.

With such a method, the carbon nanotube array sheet removed from the growth substrate is embedded in the resin composition layer disposed on the both sides of the substrate, and the substrate-side end portion of the carbon nanotube array sheet is brought into contact with the substrate, and thereafter the resin composition layer is cured to form a resin layer.

Therefore, a carbon nanotube composite material including a carbon nanotube array sheet embedded in the resin layer can be produced efficiently with an easy method.

The present invention [10] includes a method for producing a carbon nanotube composite material, the method including: preparing a fixture sheet including a conductive layer having electroconductivity; allowing vertically-aligned carbon nanotube to grow on a growth substrate; removing the vertically-aligned carbon nanotube from the growth substrate to form a carbon nanotube array sheet; disposing the carbon nanotube array sheet on both front and back sides of the fixture sheet; and heating the fixture sheet on which the carbon nanotube array sheet is disposed to bond the conductive layer-side end portion of the carbon nanotube array sheet to the interface of the conductive layer.

With such a method, the carbon nanotube array sheet removed from the growth substrate is disposed on both sides of the fixture sheet, and then heated to bond the conductive layer-side end portion of the carbon nanotube array sheet to the interface of the conductive layer.

Therefore, a carbon nanotube composite material including a carbon nanotube array sheet bonded to the interface of the conductive layer can be produced efficiently with an easy method.

The present invention [11] includes a method for producing a carbon nanotube composite material, the method including: allowing vertically-aligned carbon nanotube to grow on a growth substrate; removing the vertically-aligned carbon nanotube from the growth substrate to form a carbon nanotube array sheet; disposing the carbon nanotube array sheet on both front and back sides of the particle-containing layer containing metal particles; heating the particle-containing layer to melt the metal particles to form into a fixture sheet; and embedding the front-side carbon nanotube array sheet and the back-side carbon nanotube array sheet into the fixture sheet to bring into contact with each other in the fixture sheet.

With such a method, the carbon nanotube array sheet removed from the growth substrate is disposed on both sides of the particle-containing layer, and then heated to embed the front-side carbon nanotube array sheet and the back-side carbon nanotube array sheet into the fixture sheet to bring into contact with each other in the fixture sheet.

Therefore, a carbon nanotube composite material in which the front-side carbon nanotube array sheet and the back-side carbon nanotube array sheet are brought into contact with each other in the fixture sheet can be produced efficiently with an easy method.

The present invention [12] includes a method for producing a carbon nanotube composite material, the method including: preparing a fixture sheet formed from a resin material; allowing vertically-aligned carbon nanotube to grow on a growth substrate; removing the vertically-aligned carbon nanotube from the growth substrate to form a carbon nanotube array sheet; disposing the carbon nanotube array sheet on both front and back sides of the fixture sheet; and heating the fixture sheet on which the carbon nanotube array sheet is disposed to embed the front-side carbon nanotube array sheet and the back-side carbon nanotube array sheet in the fixture sheet to bring into contact with each other in the fixture sheet.

With such a method, the carbon nanotube array sheet removed from the growth substrate is disposed on both sides of the fixture sheet formed from a resin material, and then heated to embed the front-side carbon nanotube array sheet and the back-side carbon nanotube array sheet in the fixture sheet to bring into contact with each other in the fixture sheet.

Therefore, a carbon nanotube composite material in which the front-side carbon nanotube array sheet and the back-side carbon nanotube array sheet are brought into contact in the fixture sheet can be produced efficiently with an easy method.

<Second Invention>

The present invention [13] includes a carbon nanotube composite material including a substrate, a vertically-aligned carbon nanotube disposed on the substrate, and an adhesion layer that allows the vertically-aligned carbon nanotube to adhere to the substrate.

With this configuration, the adhesion layer allows the vertically-aligned carbon nanotube to adhere to the substrate, and therefore dropping of the CNT of the vertically-aligned carbon nanotube from the substrate can be suppressed.

The present invention [14] includes the carbon nanotube composite material of [13] above, wherein the adhesion layer is formed from thermosetting resin.

With this configuration, the adhesion layer is formed from the thermosetting resin, and therefore by forming an A-stage or B-stage resin composition layer composed of thermosetting resin composition on the substrate, then thereafter embedding the vertically-aligned carbon nanotube in the resin composition layer, and heating and curing the resin composition layer, the vertically-aligned carbon nanotube can be allowed to adhere to the substrate.

That is, the vertically-aligned carbon nanotube is embedded in the A-stage or B-stage resin composition layer, and therefore the vertically-aligned carbon nanotube does not have to be heated when it is embedded in the resin composition layer. Therefore, compared with the case where the vertically-aligned carbon nanotube is embedded in the thermoplastic resin layer melted by heating, disorganized alignment of the vertically-aligned carbon nanotube can be suppressed, and the vertically-aligned carbon nanotube can be stably and securely brought into contact with the substrate.

The present invention [15] includes the carbon nanotube composite material of [13] above, wherein the adhesion layer is formed from fluorine polymer.

With this configuration, the adhesion layer is formed from fluorine polymer, and therefore the vertically-aligned carbon nanotube can be allowed to adhere stably to the substrate, and heat resistance, oil resistance, and chemical resistance of the adhesion layer can be improved.

The present invention [16] includes the carbon nanotube composite material of any one of [13] to [15] above, further including a second substrate disposed opposite of the substrate relative to the vertically-aligned carbon nanotube, and a second adhesion layer that allows the vertically-aligned carbon nanotube to adhere to the second substrate.

With this configuration, the vertically-aligned carbon nanotube is allowed to adhere to the substrate (hereinafter referred to as first substrate) by the adhesion layer (hereinafter referred to as first adhesion layer), and allowed to adhere to the second substrate by the second adhesion layer, and therefore a structure in which the vertically-aligned carbon nanotube is disposed between the first substrate and the second substrate can be formed.

The present invention [17] includes the carbon nanotube composite material of [16] above, wherein the second adhesion layer is formed from a thermosetting resin.

With this configuration, the second adhesion layer is formed from thermosetting resin, and therefore the vertically-aligned carbon nanotube can be allowed to adhere to the second substrate by forming the A-stage or B-stage second resin composition layer composed of thermosetting resin composition on the second substrate, and then thereafter embedding the vertically-aligned carbon nanotube in the second resin composition layer so as to bring into contact with the second substrate, and heating and curing the second resin composition layer.

Therefore, disorganized alignment of the vertically-aligned carbon nanotube can be suppressed, and contact between the vertically-aligned carbon nanotube and the second substrate can be stably secured. As a result, the vertically-aligned carbon nanotube can be positioned between the first substrate and the second substrate, and contact between the vertically-aligned carbon nanotube and the first substrate and second substrate can be stably secured.

The present invention [18] includes the carbon nanotube composite material of [16] above, wherein the second adhesion layer is formed from fluorine polymer.

With this configuration, the second adhesion layer is formed from fluorine polymer, and therefore the vertically-aligned carbon nanotube can be allowed to adhere to the second substrate stably, and heat resistance, oil resistance, and chemical resistance of the second adhesion layer can be improved.

The present invention [19] includes the carbon nanotube composite material of any one of [16] to [18] above, further including a fixing member that fixes the first substrate and the second substrate so as to keep the distance between the substrate and the second substrate.

With this configuration, the fixing member fixes the first substrate and the second substrate, and therefore when a force is applied to the carbon nanotube composite material from outside, deformation of the carbon nanotube composite material can be suppressed. Furthermore, the fixing member keeps the distance between the first substrate and the second substrate, and therefore the vertically-aligned carbon nanotube can be kept while being embedded in the first adhesion layer and the second adhesion layer.

The present invention [20] includes a vibration isolator including the carbon nanotube composite material of any one of [13] to [19] above.

With this configuration, the vertically-aligned carbon nanotube is allowed to adhere to the first substrate with the first adhesion layer, and therefore when vibration is applied to the carbon nanotube composite material from outside, the vibration is transmitted to the vertically-aligned carbon nanotube through the first substrate.

Then, the plurality of carbon nanotubes included in the vertically-aligned carbon nanotube expand and contract in alignment direction by the vibration energy. At this time, air is present between the plurality of carbon nanotubes, and therefore expansion and contraction energy (kinetic energy) of the carbon nanotube is converted to thermal energy by friction with air. Vibration from outside is reduced in this manner.

Therefore, the vibration isolator including the carbon nanotube composite material can efficiently reduce vibration.

The present invention [21] includes a method for producing a carbon nanotube composite material, the method including: forming an A-stage or B-stage first resin composition layer composed of thermosetting resin composition on a first substrate; embedding the vertically-aligned carbon nanotube in the first resin composition layer; and heating and curing the first resin composition layer to form a first adhesion layer that allows the vertically-aligned carbon nanotube to adhere to the first substrate.

With such a method, the vertically-aligned carbon nanotube is embedded in the A-stage or B-stage first resin composition layer, and thereafter the first resin composition layer is heated and cured, and therefore disorganized alignment of the vertically-aligned carbon nanotube can be suppressed, and contact between the vertically-aligned carbon nanotube and the first substrate can be stably secured.

The present invention [22] includes a method for producing a carbon nanotube composite material, the method including: forming a first adhesion layer formed from fluorine polymer on a first substrate; heating the first adhesion layer to embed the vertically-aligned carbon nanotube in the first adhesion layer.

With such a method, the vertically-aligned carbon nanotube is embedded in the first adhesion layer formed from fluorine polymer, and therefore the vertically-aligned carbon nanotube can be allowed to adhere to the first substrate stably, and heat resistance, oil resistance, and chemical resistance of the first adhesion layer can be improved.

The present invention [23] includes a method for producing a carbon nanotube composite material of [21] or [22] above, the method further including: forming an A-stage or B-stage second resin composition layer composed of thermosetting resin composition on a second substrate; embedding the vertically-aligned carbon nanotube on the second resin composition layer so that the second substrate is positioned at the opposite side of the first substrate relative to the vertically-aligned carbon nanotube; heating and curing the second resin composition layer to form a second adhesion layer that allows the vertically-aligned carbon nanotube to adhere to the second substrate.

With such a method, the vertically-aligned carbon nanotube is embedded in the second resin composition layer so that the second substrate is positioned at the opposite side of the first substrate relative to the vertically-aligned carbon nanotube, and thereafter the second resin composition layer is heated and cured to form the second adhesion layer, and therefore a structure in which the vertically-aligned carbon nanotube is disposed between the first substrate and the second substrate can be achieved.

Furthermore, the vertically-aligned carbon nanotube is embedded in the A-stage or B-stage second resin composition layer, and thereafter the second resin composition layer is heated and cured, and therefore disorganized alignment of the vertically-aligned carbon nanotube can be suppressed, and contact between the vertically-aligned carbon nanotube and the second substrate can be stably secured.

As a result, the vertically-aligned carbon nanotube can be positioned between the first substrate and the second substrate, and contact between the vertically-aligned carbon nanotube and the first substrate and second substrate can be stably secured.

The present invention [24] includes a method for producing a carbon nanotube composite material of [21] or [22] above, the method including: forming a second adhesion layer formed from fluorine polymer on the second substrate; heating the second adhesion layer to embed the vertically-aligned carbon nanotube in the second adhesion layer so that the second substrate is positioned at the opposite side of the first substrate relative to the vertically-aligned carbon nanotube.

With such a method, the vertically-aligned carbon nanotube is embedded in the second adhesion layer formed from fluorine polymer, and therefore the vertically-aligned carbon nanotube can stably adhere to the second substrate, and heat resistance, oil resistance, and chemical resistance of the second adhesion layer can be improved.

The present invention [25] includes a method for producing a carbon nanotube composite material of any one of [21] to [24] above, the method further including: removing the vertically-aligned carbon nanotube from the growth substrate to form a carbon nanotube array sheet; and densifying the carbon nanotube array sheet.

With such a method, the vertically-aligned carbon nanotube is removed from the growth substrate to form the carbon nanotube array sheet, and thereafter densified, and therefore the carbon nanotube array sheet characteristics (for example, thermal conductivity, etc.) can be improved, and also the carbon nanotube composite material performance can be improved.

The present invention [26] includes a method for producing a carbon nanotube composite material of [23] or [24] above, the method further including: providing a fixing member that fixes the first substrate and the second substrate to keep the distance between the first substrate and the second substrate.

With such a method, the fixing member keeps the distance between the first substrate and the second substrate, and therefore the vertically-aligned carbon nanotube can stably keep its state of being embedded in the first adhesion layer and the second adhesion layer.

Effects of the Invention

The carbon nanotube composite material of the present invention suppresses dropping of CNT.

The method for producing a carbon nanotube composite material of the present invention allows efficient production of the carbon nanotube composite material with an easy method.

DESCRIPTION OF THE EMBODIMENTS

<First Invention>

The carbon nanotube composite material of the first invention (hereinafter referred to as CNT composite material) includes a fixture sheet, and a carbon nanotube array sheet fixed to the fixture sheet. The carbon nanotube array sheet is embedded in or bonded to both front and back sides of the fixture sheet.

In the following, a thermal conductive sheet 1 as a first embodiment of the CNT bond sheet of the first invention is described.

First Embodiment (1) Configuration of Carbon Nanotube Composite Material

Figure 1A:
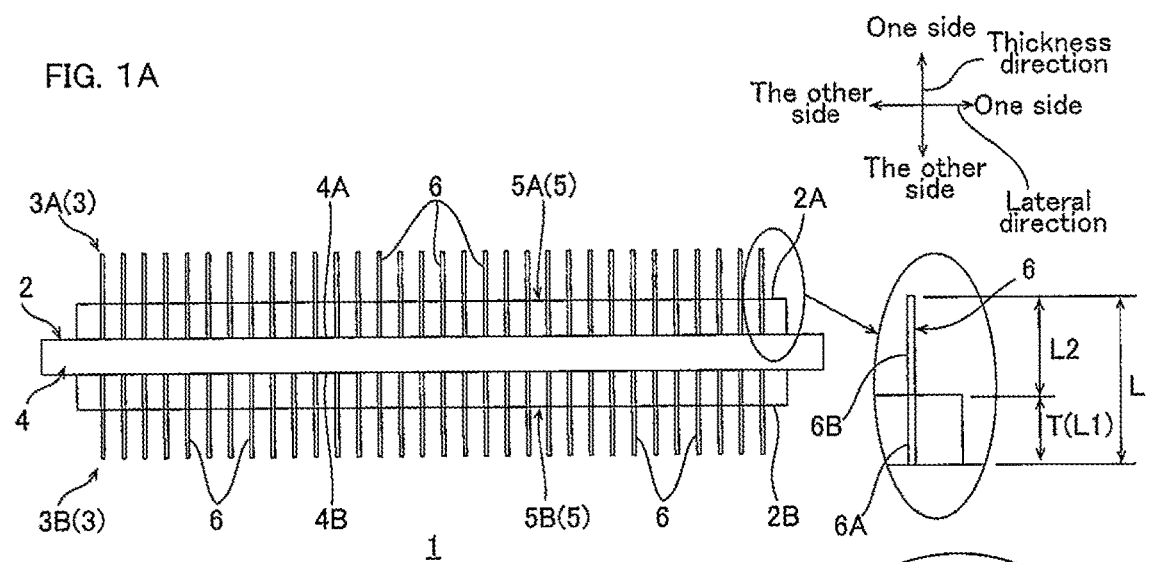
FIG. 1A is a side view of a thermal conductive sheet as a first embodiment of the carbon nanotube composite material of the present invention.

The thermal conductive sheet 1 (an example of CNT composite material) includes, as shown in FIG. 1A, a fixture sheet 2, and two carbon nanotube array sheets 3 (hereinafter referred to as CNT array sheet 3).

The fixture sheet 2 can fix the two CNT array sheets 3, and includes, in the first embodiment, a substrate 4 and two resin layers 5.

The substrate 4 has a sheet shape (film shape), to be specific, the substrate 4 has a predetermined thickness, extends in a surface direction orthogonal to its thickness direction (vertical direction and lateral direction), and has a flat front face 4A (one side in thickness direction) and a flat back face 4B (the other side in thickness direction).

The substrate 4 has, preferably, flexibility. The substrate 4 has a thickness of, for example, 10 μm or more, preferably 50 μm or more, and for example, 300 μm or less, preferably 150 μm or less.

Examples of the substrate 4 include a conductive substrate and an insulative substrate.

The conductive substrate has electroconductivity, and for example, a metal sheet, graphite sheet, carbon nanotube collected product, and a resin sheet containing conductive particles (for example, metal particles, etc.), and preferably, a metal sheet and a carbon nanotube collected product are used.

The metal sheet is a sheet made from metal. Examples of the metal include gold, silver, copper, iron, aluminum, titanium, tungsten, and alloys thereof, and preferably, copper and aluminum are used.

The case where the substrate 4 is a carbon nanotube collected product is described in the second embodiment later on.

The insulative substrate is electrically non-conductive, and for example, ceramic sheets and plastic plates are used.

The ceramic sheet is formed from a sintered inorganic material sheet. Examples of the inorganic material include boron nitride, aluminum nitride, silicon nitride, silica, alumina, magnesium oxide, and zinc oxide.

The plastic plate is a plate formed from plastics (hard resin). Examples of the plastics include plastics having a heat resistance of less than 100° C. (for example, polyethylene, polypropylene, polystyrene, vinyl chloride resin, etc.), and engineering plastics having a heat resistance of 100° C. or more (for example, poly ether ether ketone, liquid crystal polymer, polyamide, polycarbonate, polyimide, etc.).

The substrate 4 is suitably selected in accordance with application of the thermal conductive sheet 1. When a conductive substrate is selected for the substrate 4, electroconductivity can be given to the thermal conductive sheet 1, and the thermal conductive sheet 1 is configured as an electro-thermal conductive sheet. When an insulative substrate is selected for the substrate 4, electrically non-conductive properties can be given to the thermal conductive sheet 1, and the thermal conductive sheet 1 is configured as an insulative thermal conductive sheet.

The resin layer 5 is disposed on both the front face 4A and the back face 4B of the substrate 4. When the two resin layers 5 are distinguished from each other, the resin layer 5 disposed on the front face 4A of the substrate 4 is named a first resin layer 5A, and the resin layer 5 disposed on the back face 4B of the substrate 4 is named a second resin layer 5B.

One side surface in the thickness direction of the first resin layer 5A corresponds to the front face 2A of the fixture sheet 2, and the other side surface in the thickness direction of the second resin layer 5B corresponds to the back face 2B of the fixture sheet 2. That is, the fixture sheet 2 has a front face 2A (one side in the thickness direction of the first resin layer 5A) and a back face 2B (the other side in the thickness direction of the second resin layer 5B).

The resin layer 5 is formed from a resin material. Examples of the resin material include natural resins and synthetic resins (for example, thermosetting resin, thermoplastic resin, etc.), and preferably, synthetic resin is used.

The thermosetting resin is a cured product (thermosetting resin after completely cured (C stage)), and for example, epoxy resin, polyimide resin, phenol resin, urea resin, melamine resin, unsaturated polyester resin, thermosetting elastomer (for example, urethane rubber, butyl rubber, fluorine rubber, silicone rubber, acrylic rubber, etc.) are used.

Examples of the thermoplastic resin include polyester (for example, polyethylene terephthalate, etc.), polyolefin (for example, polyethylene, polypropylene, etc.), polyamide, polystyrene, polyvinyl chloride, polyvinyl alcohol (PVA), polyvinylidene chloride, polyacrylonitrile, polyurethane, fluorine polymer (for example, polytetrafluoroethylene (PTFE), perfluoroalkoxyalkane (PFA), polyvinyl fluoride, polyvinylidene fluoride, etc.), thermoplastic elastomer (for example, olefin elastomer (for example, ethylene-propylene rubber, ethylene-propylene-diene rubber, etc.), styrene elastomer, vinyl chloride elastomer, etc.).

Of these resin materials, preferably, thermoplastic resin, and more preferably, fluorine polymer, particularly preferably, PTFE and PFA are used. These resin materials can be used singly, or can be used in combination of two or more.

The resin layer 5 has a thickness T of, for example, 10 μm or more, preferably 20 μm or more, and for example, 50 μm or less, preferably 40 μm or less.

The resin layer 5 has a thickness T of, when the substrate 4 has a thickness of 100, for example, 10 or more, preferably 20 or more, and for example, 50 or less, preferably 40 or less.

The resin layer 5 can contain, as necessary, known additives. Examples of the additive include metal particles (for example, copper particles, titanium particles, aluminum particles, etc.), inorganic oxide (for example, silica particles, alumina particles, etc.), inorganic nitride (for example, aluminum nitride, boron nitride, etc.), and carbon materials (for example, carbon nanotube, graphite, fullerene, etc.). These additives can be used singly, or can be used in combination of two or more.

The CNT array sheet 3 is removed from a growth substrate 15 (described later; ref: FIG. 3B), as shown in FIG. 3C, and is a carbon nanotube collected product formed into a sheet from a plurality of carbon nanotubes 6 (hereinafter referred to as CNT 6).

To be more specific, in the CNT array sheet 3, the plurality of CNTs 6 are aligned in the thickness direction of the CNT array sheet 3, and are arranged in the surface direction (vertical direction and lateral direction) continuously to form a sheet, without being continuous in the thickness direction.

That is, the carbon nanotube array sheet 3 (CNT array sheet 3) is formed to be a sheet by continuity of the plurality of carbon nanotubes 6 (CNT 6) aligned in a predetermined direction, the continuity being in a direction orthogonal to the alignment direction of the carbon nanotube 6.

In this manner, the CNT array sheet 3 keeps its form in a state where it is removed from the growth substrate 15 (described later) and the plurality of CNTs 6 are in contact with each other in the surface direction. The CNT array sheet 3 has flexibility. Of the plurality of CNTs 6, van der Waals force acts between CNTs 6 that are adjacent to each other.

The CNT 6 may be a single-walled carbon nanotube, double-walled carbon nanotube, or multi-walled carbon nanotube, and a multi-walled carbon nanotube is preferable. The plurality of CNTs 6 may include only one of the single-walled carbon nanotube, double-walled carbon nanotube, and multi-walled carbon nanotube, or may include two or more of the single-walled carbon nanotube, double-walled carbon nanotube, and multi-walled carbon nanotube.

The CNT 6 has an average external diameter of, for example, 1 nm or more, preferably 5 nm or more, and for example, 100 nm or less, preferably 50 nm or less, more preferably 20 nm or less.

The CNT 6 has an average length L (size in average alignment direction) larger than the thickness T of the resin layer 5, as shown in FIG. 1A, to be specific, for example, 10 μm or more, preferably 50 μm or more, and for example, 1000 μm or less, preferably 500 μm or less, more preferably 200 μm or less. The average external diameter and the average length of CNT are measured, for example, by a known method such as electron microscope observation.

The average length L of the CNT 6 is, for example, more than 1 time, preferably 1.5 times or more, more preferably 2.0 times or more, and for example, 5.0 times or less, preferably 4.0 times or less, more preferably 3.0 times or less the thickness T of the resin layer 5.

In the CNT array sheet 3, the plurality of CNTs 6 have an average bulk density of, for example, 10 mg/cm$^3$ or more, preferably 50 mg/cm$^3$ or more, more preferably 100 mg/cm$^3$ or more, and for example, 500 mg/cm$^3$ or less, preferably 300 mg/cm$^3$ or less, more preferably 200 mg/cm$^3$ or less. The average bulk density of the CNT 6 is calculated from, for example, the mass per unit area (weight per unit area: mg/cm$^2$) and the average length of the carbon nanotubes (which is measured by SEM (from JEOL Corporation) or by a non-contact film thickness meter (from KEYENCE Corporation)).

The CNT array sheet 3 has a G/D ratio of, for example, 1 or more, preferably 2 or more, more preferably 5 or more, even more preferably 10 or more, and for example, 20 or less, preferably 15 or less.

The G/D ratio is, in Raman spectrum of the carbon nanotube, ratio of spectrum intensity of G-band, i.e., the peak observed near 1590 cm$^{-1}$, relative to spectrum intensity of D-band, i.e., the peak observed near the 1350 cm$^{-1}$.

The D-band spectrum is derived from carbon nanotube deficiency, and the G-band spectrum is derived from in-plane vibration of 6-membered ring of carbon.

The CNT array sheet 3 has an electric resistance (conductive resistance) in the thickness direction of, at 25° C., for example, 1Ω or less, preferably 0.1Ω or less. The electric resistance is measured by a known electric resistance measurement device.

The CNT array sheet 3 has a thermal conductivity in the thickness direction of, for example, 1 W/(m·K) or more, preferably 2 W/(m·K) or more, even more preferably 10 W/(m·K) or more, particularly preferably 30 W/(m·K) or more, and for example, 60 W/(m·K) or less, preferably 40 W/(m·K) or less. The thermal conductivity is measured by a known thermal conductivity measurement device.

As shown in FIG. 1A, the CNT array sheet 3 is embedded in both front face 2A and back face 2B of the fixture sheet 2, and supported by the fixture sheet 2.

To be more specific, of the two CNT array sheets 3, one is embedded in the first resin layer 5A and the other is embedded in the second resin layer 5B, and they are disposed so as to sandwich the substrate 4 in the thickness direction.

When the two CNT array sheets 3 are to be distinguished from each other, the CNT array sheet 3 embedded in the first resin layer 5A is named a first CNT array sheet 3A, and the CNT array sheet 3 embedded in the second resin layer 5B is named a second CNT array sheet 3B.

The substrate 4-side end portion of the CNT array sheet 3 is embedded in the corresponding resin layer 5 to be brought into contact with the substrate 4, and the non-substrate 4-side opposite end portion of the CNT array sheet 3 is projected from the corresponding resin layer 5.

That is, the other side end portion of the first CNT array sheet 3A is embedded in the first resin layer 5A to be brought into contact with the front face 4A of the substrate 4, and one side end portion of the first CNT array sheet 3A is projected from the surface of the first resin layer 5A (front face 2A of the fixture sheet 2) to one side in the thickness direction to be a free end. One side end portion of the second CNT array sheet 3B is embedded in the second resin layer 5B to be brought into contact with the back face 4B of the substrate 4, and the other side end portion of the second CNT array sheet 3B is projected from the surface of the second resin layer 5B (back face 2B of the fixture sheet 2) to the other side in the thickness direction to be a free end.

Therefore, in each CNT array sheet 3, the CNTs 6 have embedded portions 6A embedded in the corresponding resin layer 5, and projected portions 6B projected from the corresponding resin layer 5. The thickness direction of the CNT array sheet 3 coincide with the thickness direction of the substrate 4, and the CNTs 6 of the CNT array sheet 3 extend along the thickness direction of the substrate 4.

The embedded portion 6A penetrates the corresponding resin layer 5. The length L1 of the embedded portion 6A is, for example, in the range that is the same as the range of the thickness T of the resin layer 5. The percentage of the length L1 of the embedded portion 6A relative to the length L of the CNT 6 as 100% is, for example, 20% or more, preferably 30% or more, and for example, 70% or less, preferably 50% or less.

The projected portion 6B has a length L2 of, for example, 1 μm or more, preferably 10 μm or more, and for example, 100 μm or less, preferably 70 μm or less. The percentage of the length L2 of the projected portion 6B relative to the length L of the CNT 6 as 100% is, for example, 30% or more, preferably 50% or more, and for example, 80% or less, preferably 70% or less.

The ratio of the length L2 of the projected portion 6B relative to the length L1 of the embedded portion 6A (L2/L1) is, for example, 0.4 or more, preferably 1 or more, and for example, 4 or less, preferably 2.5 or less.

When the ratio of the length L1 of the embedded portion 6A is the above-described lower limit or more (when the ratio of the length L2 of the projected portion 6B is the above-described upper limit or less), the CNT array sheet 3 can be reliably supported by the resin layer 5, and when the ratio of the length L2 of the projected portion 6B is the above-described lower limit or more (when the ratio of the length L1 of the embedded portion 6A is the above-described upper limit or less), conformability of the CNT array sheet 3 to the object surface can be improved.

Such a thermal conductive sheet 1 preferably has flexibility.

The thermal conductive sheet 1 has an electric resistance (conductive resistance) in the thickness direction of, when the substrate 4 is a conductive substrate, at 25° C., for example, 10Ω or less, preferably 1Ω or less, more preferably 0.1Ω or less, and when the substrate 4 is an insulative substrate, at 25° C., for example, 10$^3$Ω or more, preferably 10$^4$Ω or more.

The thermal conductive sheet 1 has a thermal conductivity in the thickness direction of, for example, 1 W/(m·K) or more, preferably 2 W/(m·K) or more, more preferably 10 W/(m·K) or more, even more preferably 25 W/(m·K) or more, particularly preferably 50 W/(m·K) or more, and for example, 300 W/(m·K) or less, preferably 100 W/(m·K) or less.

(2) Method for Producing a CNT Composite Material

Next, description is given as to a method for producing a thermal conductive sheet 1 (an example of CNT composite material). The case where the resin layer 5 is thermoplastic resin is described.

Figure 4A:
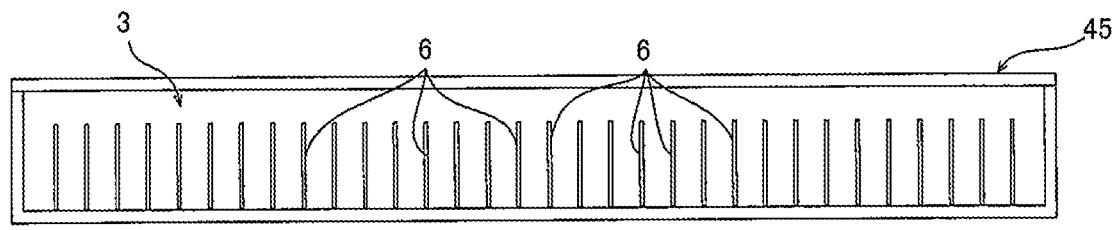
FIG. 4A illustrates a step of densifying the CNT array sheet shown in FIG. 3C, showing a step of accommodating the CNT array sheet in a heat resistant vessel.
Figure 4B:
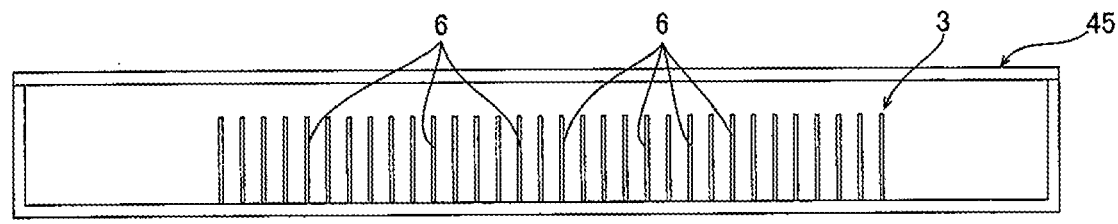
FIG. 4B shows, following FIG. 4A, a step of heating the CNT array sheet to densify the CNT array sheet.
Figure 4C:
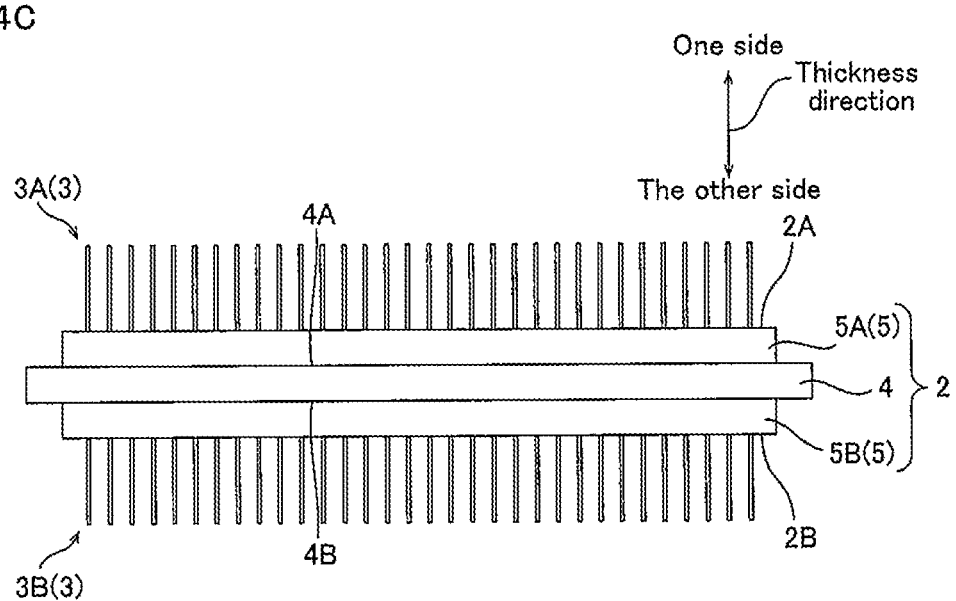
FIG. 4C shows a step of disposing the densified CNT array sheet shown in FIG. 4B on both front and back sides of a fixture sheet.

To produce a thermal conductive sheet 1, as shown in FIG. 4C, first, a fixture sheet 2 and a CNT array sheet 3 are prepared.

To prepare the fixture sheet 2, a resin layer 5 formed from the above-described thermoplastic resin is disposed on both the front face 4A and the back face 4B of the substrate 4 (fixture sheet preparation step).

The resin layer 5 can be disposed on both sides of the substrate 4 by, without particular limitation, for example, applying the above-described thermoplastic resin on both sides of the substrate 4 to form a resin layer 5, or forming a resin sheet from the above-described thermoplastic resin and disposing it on both sides of the substrate 4. Of these methods, preferably, the resin sheet is formed from the thermoplastic resin, and then disposed on both sides of the substrate 4.

In this manner, the fixture sheet 2 including the substrate 4, and the resin layer 5 disposed on both the front face 4A and the back face 4B of the substrate 4, to be more specific, the fixture sheet 2 including the substrate 4, the first resin layer 5A disposed on the front face 4A of the substrate 4, and the second resin layer 5B disposed on the back face 4B of the substrate 4 is prepared.

Figure 2A:
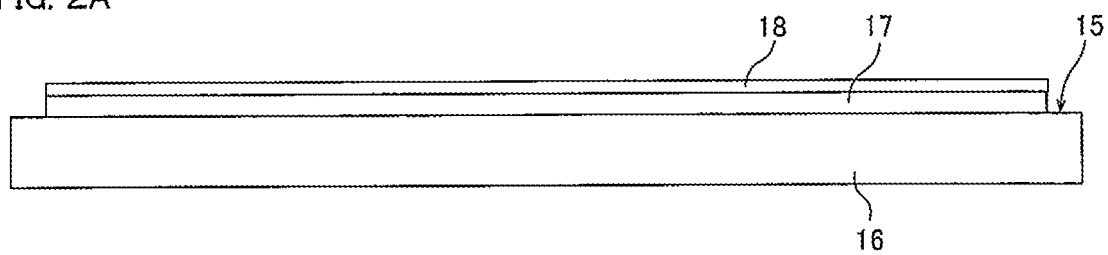
FIG. 2A illustrates an embodiment of a step of allowing vertically-aligned carbon nanotubes (VACNTs) to grow on a growth substrate, showing a step of forming a catalyst layer on a substrate.
Figure 2B:
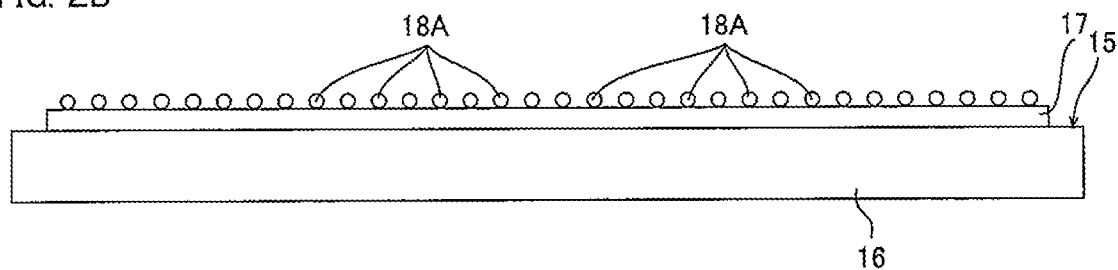
FIG. 2B shows, following FIG. 2A, heating a substrate to cause coagulation of the catalyst layer into a plurality of granular bodies.
Figure 2C:
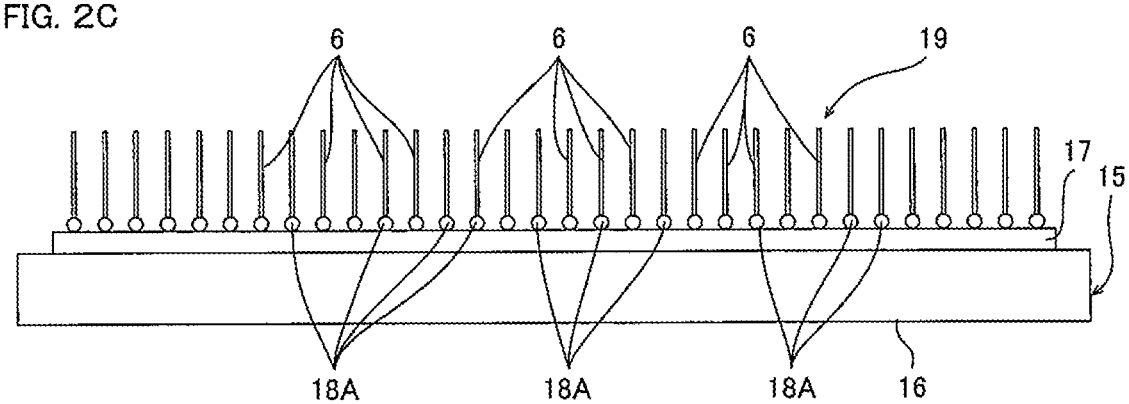
FIG. 2C shows, following FIG. 2B, a step of supplying a source gas to the plurality of granular bodies to allow growth of a plurality of carbon nanotubes to prepare VACNTs.

To prepare the CNT array sheet 3, as shown in FIG. 2A to FIG. 2C, for example, vertically-aligned carbon nanotubes 19 (in the following, referred to as VACNTs 19) are allowed to grow on the growth substrate 15 by chemical vapor deposition (CVD method) (CNT growth step).

To be specific, as shown in FIG. 2A, first, the growth substrate 15 is prepared. The growth substrate 15 is not particularly limited, and for example, a known substrate used for CVD method is used, and a commercially available product can be used.

Examples of the growth substrate 15 include silicon substrate, and a stainless steel substrate 16 on which a silicon dioxide film 17 is stacked, and preferably, the stainless steel substrate 16 on which the silicon dioxide film 17 is stacked is used. In FIG. 2A to FIG. 3C, the growth substrate 15 is the stainless steel substrate 16 on which the silicon dioxide film 17 is stacked.

Then, as shown in FIG. 2A, on the growth substrate 15, preferably on the silicon dioxide film 17, a catalyst layer 18 is formed. To form the catalyst layer 18 on the growth substrate 15, a film of metal catalyst is formed by a known film-forming method on the growth substrate 15 (preferably, silicon dioxide film 17).

Examples of the metal catalyst include iron, cobalt, and nickel, preferably, iron is used. Such a metal catalyst can be used singly, or can be used in combination of two or more. Examples of the film-forming method include vacuum deposition and sputtering, and preferably, vacuum deposition is used.

In this manner, the catalyst layer 18 is disposed on the growth substrate 15. When the growth substrate 15 is a stainless steel substrate 16 on which the silicon dioxide film 17 is stacked, the silicon dioxide film 17 and the catalyst layer 18 can be formed simultaneously by, for example, as described in Japanese Unexamined Patent Publication No. 2014-94856, applying a mixture solution in which a silicon dioxide precursor solution and a metal catalyst precursor solution are mixed on a stainless steel substrate 16, and thereafter causing phase separation in the mixture solution, and then drying.

Then, the growth substrate 15 on which the catalyst layer 18 is disposed is heated, as shown in FIG. 2B, for example, at 700° C. or more and 900° C. or less. In this manner, the catalyst layer 18 goes through coagulation to form a plurality of granular bodies 18A.

Then, a source gas is supplied to the heated growth substrate 15, as shown in FIG. 2C. The source gas contains a hydrocarbon gas with a number of carbon atoms of 1 to 4 (lower hydrocarbon gas). Examples of the hydrocarbon gas with carbon atoms of 1 to 4 include methane gas, ethane gas, propane gas, butane gas, ethylene gas, and acetylene gas, and preferably, acetylene gas is used.

The source gas can contain, as necessary, hydrogen gas, inert gas (for example, helium, argon, etc.), and water vapor.

The source gas is supplied for, for example, 1 minute or more, preferably 5 minutes or more, and for example, 60 minutes or less, preferably 30 minutes or less.

In this manner, the plurality of CNTs 6 are allowed to grow, originating from the plurality of granular bodies 18A. In FIG. 2C, for convenience, one CNT 6 is grown from the one granular body 18A, but it is not limited thereto, and a plurality of CNTs 6 can be grown from one granular body 18A.

Such a plurality of CNTs 6 extend on the growth substrate 15 so that they are substantially parallel to each other in the thickness direction (up-down direction) of the growth substrate 15. That is, the plurality of CNTs 6 are aligned orthogonal to the growth substrate 15 (vertically aligned).

In this manner, the VACNTs 19 grow on the growth substrate 15.

Figure 6A:
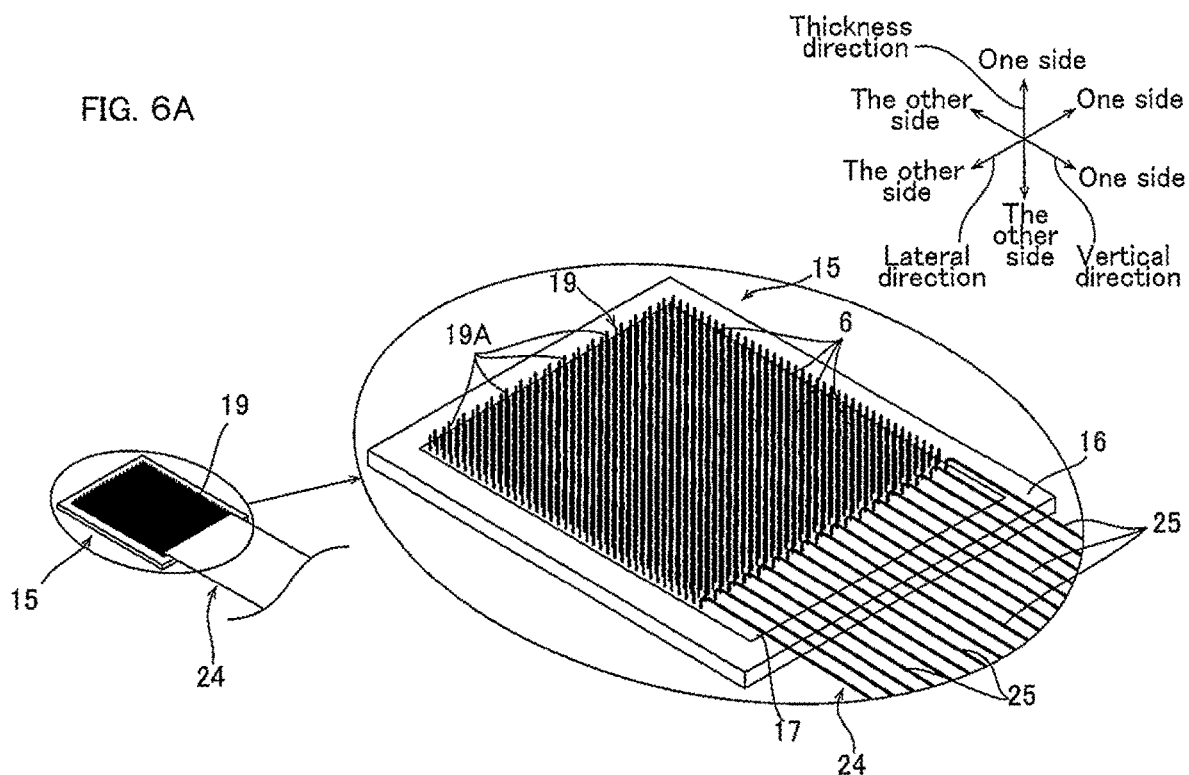
FIG. 6A illustrates an embodiment of the method for producing a web stacked sheet shown in FIG. 5, showing a step of drawing a carbon nanotube web (CNT web) from the VACNTs.

The VACNTs 19 include, as shown in FIG. 6A, a plurality of rows 19A arranged in lateral direction. In each of the rows 19A, the plurality of CNTs 6 are arranged linearly in vertical direction. In the VACNTs 19, the plurality of CNTs 6 are densified in the surface direction (vertical direction and lateral direction).

Figure 3A:
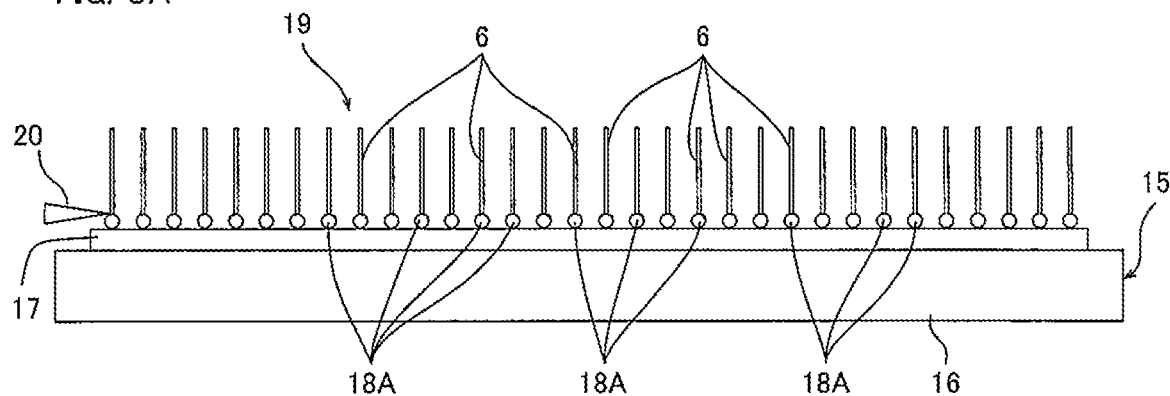
FIG. 3A illustrates a step of removing VACNTs, showing a step of cutting VACNTs from the growth substrate.
Figure 3B:
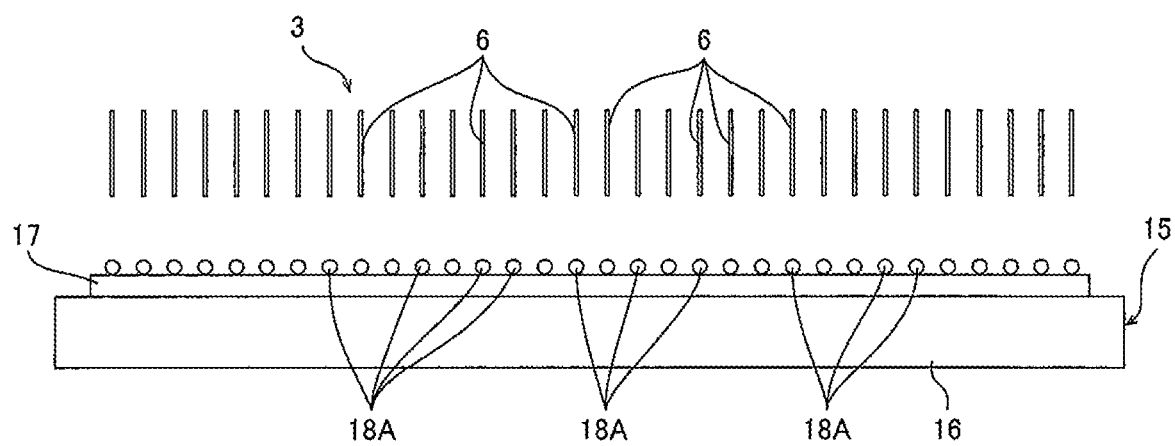
FIG. 3B shows, following FIG. 3A, a step of removing the VACNTs from the growth substrate to form a carbon nanotube array sheet (CNT array sheet).
Figure 3C:
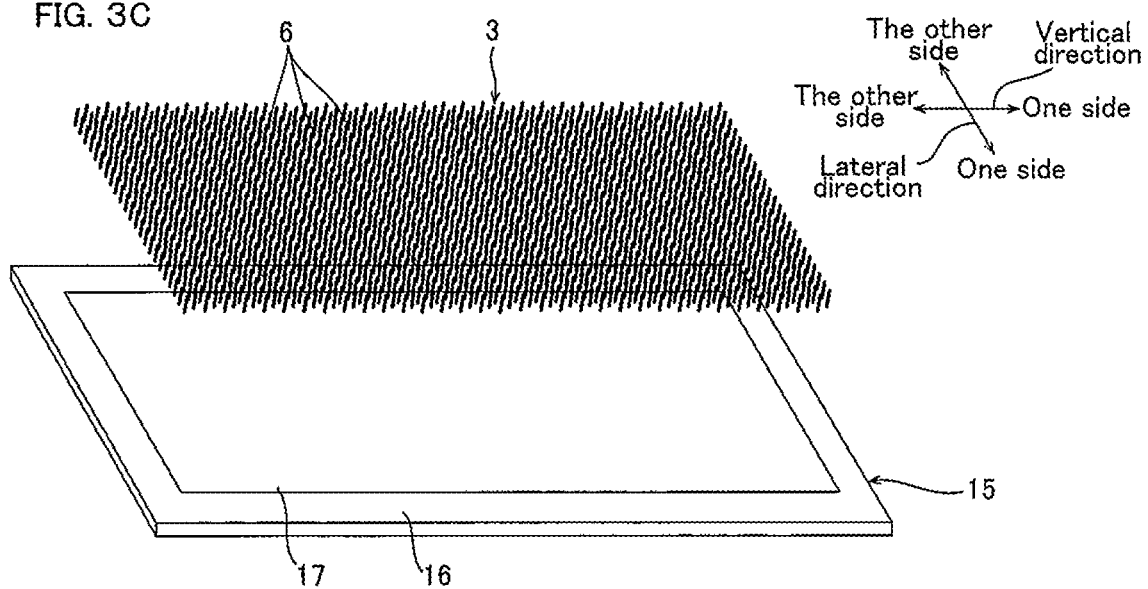
FIG. 3C is a perspective view of the CNT array sheet shown in FIG. 3B.

Then, as shown in FIG. 3A and FIG. 3B, the VACNTs 19 are removed from the growth substrate 15 (removal step).

To remove the VACNTs 19 from the growth substrate 15, for example, a cutting blade 20 is slid along the upper face of the growth substrate 15 to collectively cut the proximal end portion (growth substrate 15 side end portion) of the plurality of CNTs 6. The VACNTs 19 are separated from the growth substrate 15 in this manner.

Examples of the cutting blade 20 include known metal blades such as a cutter blade, and a razor, and preferably, a cutter blade is used.

Then, the separated VACNTs 19 are taken out, as shown in FIG. 3B, from the growth substrate 15. In this manner, the VACNTs 19 are removed from the growth substrate 15, and a CNT array sheet 3 is formed. By repeating the above-described steps, two CNT array sheets 3, to be specific, a first CNT array sheet 3A and a second CNT array sheet 3B are prepared.

Such a CNT array sheet 3 can be used as is as the thermal conductive sheet 1, but because of its relatively low average bulk density, in view of improvement in thermal conductivity, preferably it is densified (densifying step).

For densifying, for example, the CNT array sheet 3 can be heated (ref: FIG. 4A and FIG. 4B) or a volatile liquid can be supplied to the CNT array sheet 3.

To heat the CNT array sheet 3, for example, as shown in FIG. 4A, the CNT array sheet 3 is stored in a heat resistant vessel 45, and disposed in a heating furnace.

The heat resistant vessel 45 is a heat resistant vessel having a heat-resistant temperature of more than 2600° C., and examples thereof include known heat resistant vessels such as a carbon vessel made from carbon and a ceramic vessel made from ceramics. Of these heat resistant vessels, preferably, carbon vessel is used.

Examples of the heating furnace include a resistance heating furnace, induction heating furnace, and direct electric furnace, and preferably, the resistance heating furnace is used. The heating furnace may be a batch type, or a continuous type.

Then, an inert gas is supplied to the heating furnace to replace inside the heating furnace with an inert gas atmosphere. Examples of the inert gas include nitrogen and argon, and preferably, argon is used.

Then, the temperature in the heating furnace is increased at a predetermined temperature increase speed to the heating temperature, and thereafter it is allowed to stand for a predetermined time while the temperature is kept.

The temperature increase speed is, for example, 1° C./minute or more, preferably 5° C./minute or more, and for example, 40° C./minute or less, preferably 20° C./minute or less.

The heating temperature is, for example, 2600° C. or more, preferably 2700° C. or more, more preferably 2800° C. or more. When the heating temperature is the above-described lower limit or more, the plurality of CNTs 6 can be reliably densified with a high density in the CNT array sheet 3.

The heating temperature can be less than the sublimation temperature of the CNT 6, preferably 3000° C. or less. When the heating temperature is the above-described upper limit or less, sublimation of the CNT 6 can be suppressed.

The predetermined time can be, for example, 10 minutes or more, preferably 1 hour or more, and for example, 5 hours or less, more preferably 3 hours or less.

The CNT array sheet 3 is preferably heated under no load (state where no load is applied to the CNT array sheet 3, that is, under atmospheric pressure). To heat the CNT array sheet 3 under no load, as shown in FIG. 4A, the CNT array sheet 3 is stored in the heat resistant vessel 45 so that the CNT array sheet 3 is spaced apart from the cover and the side wall of the heat resistant vessel 45.

The CNT array sheet 3 is heated in this manner. When the CNT array sheet 3 is heated, in the CNT array sheet 3, crystallinity of graphene forming the plurality of CNTs 6 improves, and the CNT 6 alignment (linearity) improves. Then, in the CNT array sheet 3, the CNTs 6 adjacent to each other gather together to form bundles while keeping their alignment (linearity) due to van der Waals force working between them.

In this manner, the CNT array sheet 3 is entirely thickened homogenously, and the CNT array sheet 3 is densified. Thereafter, the CNT array sheet 3 is cooled (for example, natural cooling) as necessary.

The CNT array sheet 3 after heating has a thickness of about the same as the thickness of the CNT array sheet 3 before heating, because the plurality of CNTs 6 are densified while keeping their alignment (linearity). To be more specific, the CNT array sheet 3 after heating has a thickness of, relative to the thickness of the CNT array sheet 3 before heating, for example, 95% or more and 105% or less, preferably 100%.

The CNT array sheet 3 after heating has a volume of, relative to the volume of the CNT array sheet 3 before heating, for example, 10% or more, preferably 30% or more, and for example, 70% or less, preferably 50% or less.

The CNT array sheet 3 after heating has a G/D ratio of, for example, 2 or more.

When a volatile liquid is supplied to the CNT array sheet 3, for example, the volatile liquid is sprayed over the CNT array sheet 3, or the CNT array sheet 3 is immersed in the volatile liquid.

Examples of the volatile liquid include water and an organic solvent. Examples of the organic solvent include lower (C1 to 3) alcohols (for example, methanol, ethanol, propanol, etc.), ketones (for example, acetone, etc.), ethers (for example, diethylether, tetrahydrofuran, etc.), alkylesters (for example, ethyl acetate, etc.), halogenated aliphatic hydrocarbons (for example, chloroform, dichloromethane, etc.), and polar aprotic solvents (for example, N-methylpyrrolidone, dimethylformamide, etc.).

Of these volatile liquids, preferably, water is used. Such a volatile liquid can be used singly, or can be used in combination of two or more.

When the volatile liquid is supplied to the CNT array sheet 3, the volatile liquid is vaporized, and the plurality of CNTs 6 gather together, which improves density of the CNT array sheet 3.

Such densifying treatment is performed at least once, and it can be repeated a plurality of times. The same densifying treatment can be repeated a plurality of times, and different types of densifying treatment can be performed in combination. For example, the above-described heating treatment singly can be repeated a plurality of times, or the above-described heating treatment can be performed in combination with the above-described liquid supply treatment.

In the CNT array sheet 3 after densification, the plurality of CNTs 6 have an average bulk density of, for example, 50 mg/cm$^3$ or more, an electric resistance (conductive resistance) in the thickness direction at 25° C. of, for example, 1Ω or less, and a thermal conductivity in the thickness direction of, for example, 10 W/(m·K) or more.

In the above-described manner, the fixture sheet 2 including the substrate 4 and two resin layers 5, and two CNT array sheets 3 are prepared.

Then, as shown in FIG. 4C, one CNT array sheet 3 is disposed on the first resin layer 5A (front side resin layer 5), and the other CNT array sheet 3 is disposed on the second resin layer 5B (back side resin layer 5) (disposing step).

To be more specific, the first CNT array sheet 3A is disposed on one side in thickness direction of the first resin layer 5A (front face 2A of fixture sheet 2), and the second CNT array sheet 3B is disposed on the other side in thickness direction of the second resin layer 5B (back face 2B of fixture sheet 2). In this manner, the first CNT array sheet 3A and the second CNT array sheet 3B are disposed so as to sandwich the fixture sheet 2 in the thickness direction.

Then, the fixture sheet 2 in which the first CNT array sheet 3A and the second CNT array sheet 3B are disposed is heated (heating step).

The heating temperature is a temperature of the melting (softening) temperature of the resin layer 5 (thermoplastic resin) or more, and less than the temperature the resin layer 5 (thermoplastic resin) is burned, and for example, 300° C. or more and 400° C. or less. The heating time is, for example, 1 minute or more, and for example, 30 minutes or less, preferably 10 minutes or less.

In this manner, the resin layer 5 is melted, as shown in FIG. 1A, and the CNT array sheet 3 is embedded in the corresponding resin layer 5, the substrate 4-side end portion of the CNT array sheet 3 penetrates the corresponding resin layer 5, and is brought into contact with the substrate 4.

To be more specific, the first resin layer 5A melts to embed the first CNT array sheet 3A in the first resin layer 5A, and the other side end portion of the first CNT array sheet 3A is brought into contact with the front face 4A of the substrate 4. Furthermore, the second resin layer 5B melts to embed the second CNT array sheet 3B in the second resin layer 5B, and one side end portion of the second CNT array sheet 3B is brought into contact with the back face 4B of the substrate 4.

The melted resin layer 5 is brought into close contact with the substrate 4 and the CNT array sheet 3, and goes between the plurality of CNTs 6.

In the heating step, as necessary, the first CNT array sheet 3A and the second CNT array sheet 3B are pressed to face the substrate 4 from outside to inside in the thickness direction.

The pressure is, for example, 0.1 MPa or more, preferably 0.5 MPa or more, and for example, 1.0 MPa or less.

In this manner, the other side end portion of the first CNT array sheet 3A and one side end portion of the second CNT array sheet 3B are reliably brought into contact with the substrate 4.

Thereafter, by cooling, the melted resin layer 5 is cured while being in close contact with the substrate 4 and CNT array sheet 3. In this manner, the CNT array sheet 3 is fixed to the corresponding resin layer 5 while the end portion of the CNT array sheet 3 is brought into contact with the substrate 4, and supported by the fixture sheet 2.

In the above-described manner, the thermal conductive sheet 1 is produced.

In the method for producing the above-described thermal conductive sheet, the case where the resin layer 5 is formed from thermoplastic resin is described, but when the resin layer 5 is formed from thermosetting resin, first, uncured resin composition corresponding to the above-described thermosetting resin is prepared. The uncured resin composition is a liquid and in A-stage state.

Then, the resin composition is applied on both of the front face 4A and the back face 4B of the substrate 4, to form the resin composition layer on both of the front face 4A and the back face 4B of the substrate 4. Thereafter, the resin composition layer keeps its A-stage state, or the resin composition layer is brought into semi-cured B-stage state.

Then, the CNT array sheet 3 is embedded in both of the front side and back side of the resin composition layer, and the substrate 4-side end portion of the CNT array sheet 3 is brought into contact with the substrate 4. Thereafter, heating is conducted to a predetermined curing temperature to cure (completely cure) the resin composition layer to form a C-stage state resin layer 5. The thermal conductive sheet 1 can be produced in this manner as well.

(3) Embodiment of Thermal Conductive Sheet Use

Figure 1B:
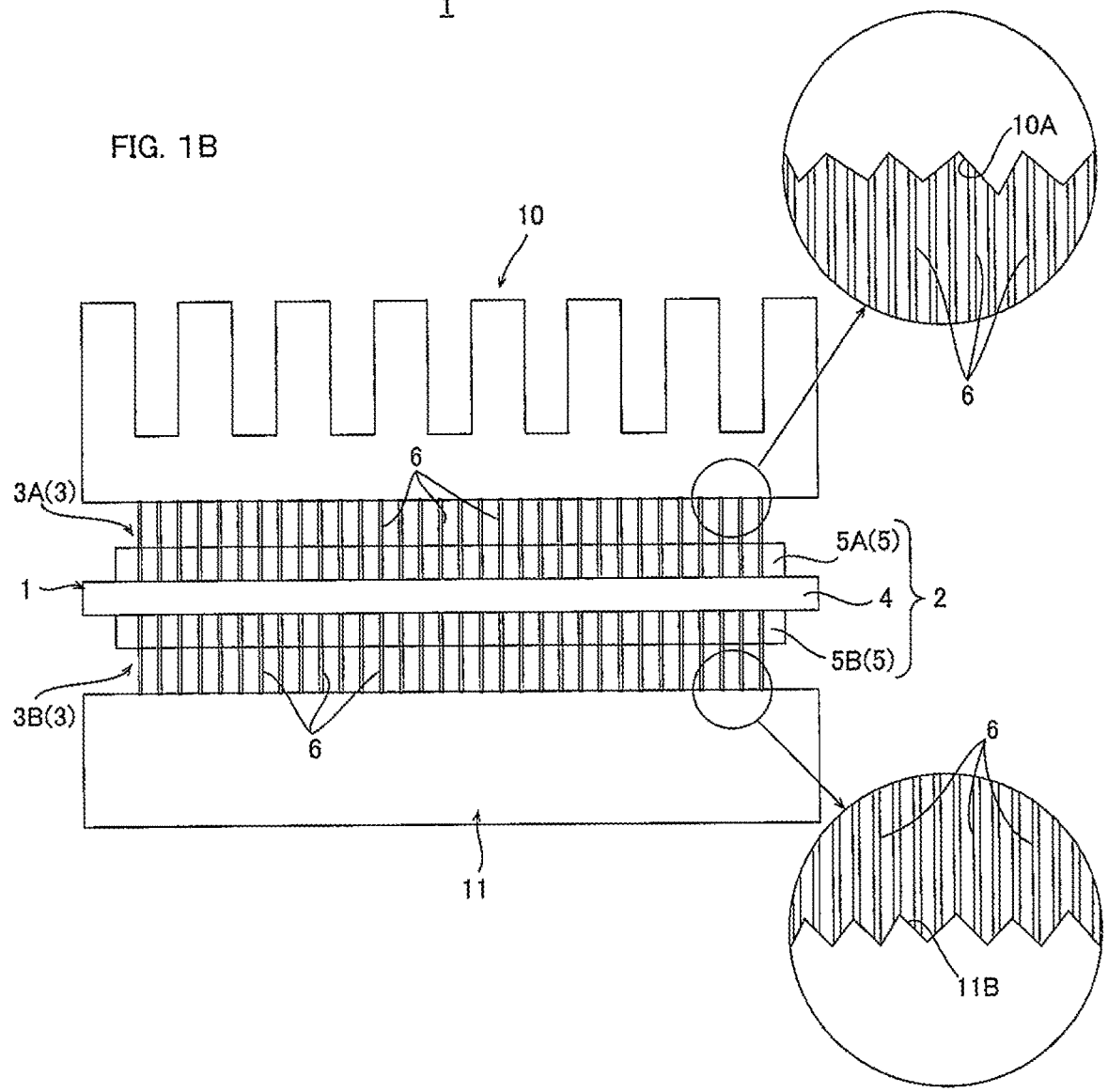
FIG. 1B is a schematic diagram illustrating a state in which the thermal conductive sheet shown in FIG. 1A is disposed between the electronic component and the heat sink.

Such a thermal conductive sheet 1 is disposed, as a TIM, as shown in FIG. 1B, for example, between the electronic component 11 (object) and a heat release member 10 (object) in the thickness direction and used.

Examples of the electronic component 11 include a semiconductor element (IC (integrated circuit) chip, etc.), light-emitting diode (LED), high output laser oscillation element, high output lamp, and power semiconductor element.

When the electronic component 11 is, for example, a semiconductor element, an electro-thermal conductive sheet in which the substrate 4 is a conductive substrate is suitably selected as the thermal conductive sheet 1. When the electronic component 11 is, for example, an LED, for the thermal conductive sheet 1, an insulating thermal conductive sheet in which the substrate 4 is an insulative substrate is suitably selected.

Examples of the heat release member 10 include a heat sink and heat spreader.

On the surface 11B of the electronic component 11, and on the surface 10A of the heat release member 10, subtle dents and bumps (surface roughness) are formed. They have a surface roughness Rz (10-point average roughness in accordance with JIS B0601-2013) of, for example, 1 μm or more and 10 μm or less.

In the thermal conductive sheet 1, the plurality of CNTs 6 of the first CNT array sheet 3A conforms to the subtle dents and bumps of the surface 10A of the heat release member 10 and are stably in contact with the surface 10A of the heat release member 10. The plurality of CNTs 6 of the second CNT array sheet 3B conform to the subtle dents and bumps of the surface 11B of the electronic component 11, and are stably in contact with the surface 11B of the electronic component 11.

Therefore, when the electronic component 11 generates heat, heat from the electronic component 11 is conducted to the heat release member 10 through the second CNT array sheet 3B, substrate 4, and first CNT array sheet 3A in sequence.

(4) Operations and Effects

The thermal conductive sheet 1 includes, as shown in FIG. 1A, the CNT array sheet 3 on the fixture sheet 2 through resin. The CNT array sheet 3 includes the plurality of CNTs 6 aligned in the thickness direction, and arranged continuously in surface direction to form a sheet shape.

Therefore, as shown in FIG. 1B, when the thermal conductive sheet 1 is brought into contact with an object (heat release member 10 and electronic component 11), the plurality of CNTs 6 of the CNT array sheet 3 can be allowed to conform to the subtle dents and bumps on the surface of the object.

Furthermore, the CNT array sheet 3 is embedded in both of the front face 2A and the back face 2B of the fixture sheet 2, as shown in FIG. 1A, and therefore the CNT 6 of the CNT array sheet 3 can be suppressed from dropping from the fixture sheet 2.

When the CNT array sheet 3 has an average bulk density of 50 mg/cm$^3$ or more, the thermal conductivity of the CNT array sheet 3 can be improved, and thermal conductivity of the thermal conductive sheet 1 can be improved.

The CNT array sheet 3 is embedded in the fixture sheet 2, as shown in FIG. 4C, after removed from the growth substrate 15. Therefore, the CNT array sheet 3 can be removed from the growth substrate 15, and densified, and thereafter embedded in the fixture sheet 2.

The substrate 4-side end portion of the CNT array sheet 3 is embedded in the corresponding resin layer 5, and in contact with the substrate 4, as shown in FIG. 1A. Therefore, the CNT 6 of the CNT array sheet 3 can be reliably suppressed from dropping from the fixture sheet 2, and thermal conductivity of the thermal conductive sheet 1 can be reliably improved.

When the substrate 4 is a conductive substrate having electroconductivity, the electroconductive CNT array sheet 3 is brought into contact with the electroconductive substrate 4, and therefore electroconductivity can be given to the thermal conductive sheet 1.

When the substrate 4 is a ceramic sheet formed from a sintered inorganic material, the CNT array sheet 3 is brought into contact with the electrically non-conductive substrate 4, and therefore electrically non-conductive properties can be given to the thermal conductive sheet 1.

As shown in FIG. 1A, when the resin layer 5 is formed from thermoplastic resin, the CNT array sheet 3 removed from the growth substrate 15 is disposed on the resin layer 5 disposed on both sides of the substrate 4, and thereafter heated, the substrate end portion of the CNT array sheet 3 can be embedded in the corresponding resin layer 5, and brought into contact with the substrate 4.

When the resin layer 5 is formed from thermosetting resin, the CNT array sheet 3 removed from the growth substrate 15 is embedded in the resin composition layer disposed on both sides of the substrate 4, and the substrate end portion of the CNT array sheet 3 is brought into contact with the substrate 4, and thereafter the resin composition layer is cured to form a resin layer 5.

Therefore, the thermal conductive sheet 1 including the CNT array sheet 3 embedded in the corresponding resin layer 5 can be produced efficiently with an easy method.

Second Embodiment

Figure 5:
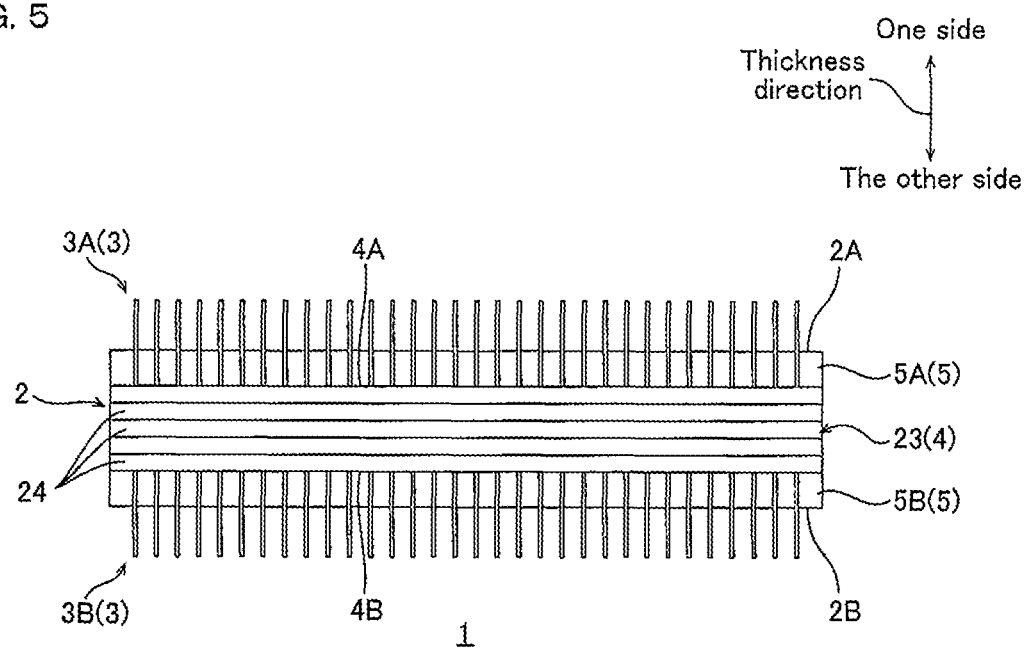
FIG. 5 is a side view of a thermal conductive sheet as a second embodiment of the carbon nanotube composite material of the present invention.
Figure 6B:
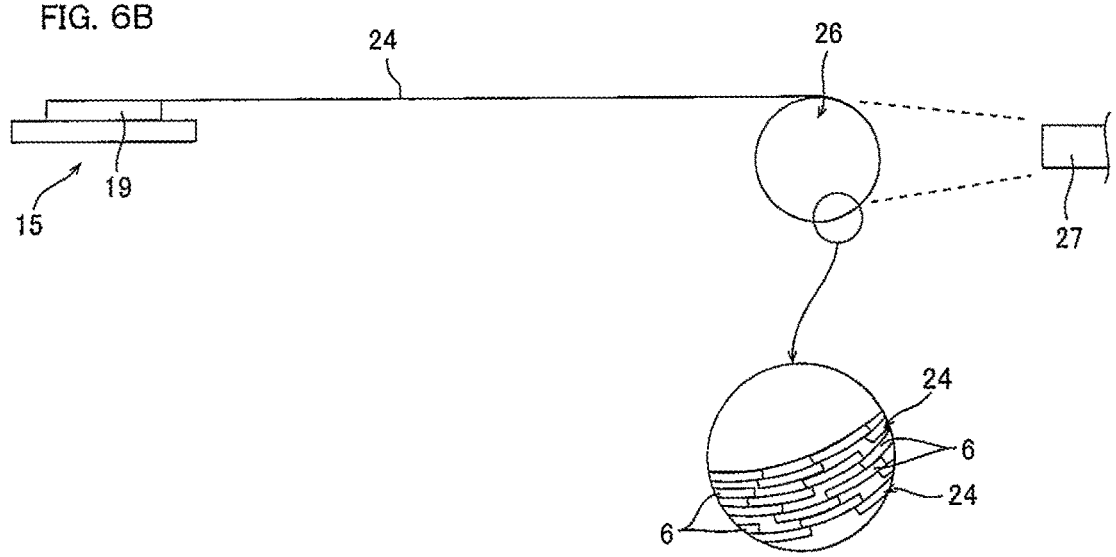
FIG. 6B shows, following FIG. 6A, a step of stacking the CNT web.
Figure 6C:
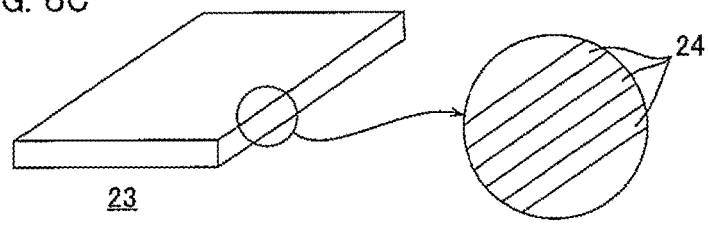
FIG. 6C shows, following FIG. 6B, a step of developing the stacked CNT web to form the web stacked sheet.

Next, description is given as to the second embodiment of the present invention with reference to FIG. 5 to FIG. 6C. In the second embodiment, the same reference numerals are given to those members that are the same as those in the first embodiment, and description thereof is omitted.

In the second embodiment, as shown in FIG. 5, the substrate 4 is a carbon nanotube collected product. The carbon nanotube collected product is an assembly of the plurality of CNTs, and examples thereof include press molded sheet, the above-described CNT array sheet 3, and carbon nanotube web stacked sheet (hereinafter referred to as web stacked sheet), and preferably, a CNT array sheet 3 and a web stacked sheet are used. In FIG. 5, the web stacked sheet 23 is used for the substrate 4.

The press molded sheet is formed into a sheet by a known press molding from the plurality of CNTs, and the plurality of CNTs are disposed at random.

The web stacked sheet 23 includes a plurality of carbon nanotubes web 24 (hereinafter referred to as CNT web 24) stacked in the thickness direction.

The CNT web 24 is formed into a sheet, as shown in FIG. 6A, in which a plurality of carbon nanotubes single yarns 25 (hereinafter referred to as CNT single yarn 25) are arranged in parallel in a direction intersecting the direction the CNT single yarns 25 extend.

The CNT single yarn 25 is formed by continuously and linearly connected bundle of the plurality of CNTs 6. The CNT single yarn 25 is an untwisted thread which is not twisted together, and the CNT single yarn 25 has an external diameter of, for example, 5 nm or more and 100 nm or less.

To prepare such a web stacked sheet 23, first, as shown in FIG. 6A, in the same manner as in the above-described first embodiment, a growth substrate 15 on which VACNTs 19 are disposed is prepared.

As shown in FIG. 6B, a roller 26 is disposed in spaced apart relation relative to the growth substrate 15. The roller 26 has a cylindrical shape, and rotatable around its axis. Preferably, a resin film is provided on the circumferential face of the roller 26.

Then, the CNT web 24 is drawn from the VACNTs 19, as shown in FIG. 6A.

To draw the CNT web 24 from the VACNTs 19, of the VACNTs 19, the CNT 6 positioned at the end portion of each row 19A is held collectively with a drawing device, which is not shown, and then pulled.

Then, the pulled CNT 6 is drawn out from the corresponding granular body 18A (ref: FIG. 3A). At this moment, the CNTs 6 which are adjacent to the drawn CNTs 6 are attached to the drawn CNT 6 by the frictional force with the CNT 6, Van der Waals force, etc., and drawn.

In this manner, the plurality of CNTs 6 are drawn sequentially from the VACNTs 19, to form CNT single yarns 25 in which the plurality of CNTs 6 are continuously connected linearly.

Such CNT single yarns 25 are arranged in parallel in a plural number in a direction intersecting (crossing) the direction of extension of the CNT single yarns 25, as shown in an enlargement figure in FIG. 6A, because the CNT 6 in each row 19A is simultaneously and at once in parallel drawn.

Then the plurality of CNTs single yarns 25 arranged in parallel has a substantially sheet shape, and formed as a CNT web 24. That is, the CNT web 24 is formed by drawing the plurality of CNTs single yarns 25 arranged in parallel.

Then, as shown in FIG. 6B, the downstream end portion in drawing direction of the CNT web 24 is fixed to the roller 26, and the roller 26 is rotated. In this manner, the CNT web 24 is wound around the roller 26 a plurality of times.

Then, the CNT web 24 wound around the roller 26 is cut in the axial direction of the roller 26 with a cutting blade (for example, razor, cutter, etc.), and removed from the roller 26.

In this manner, as shown in FIG. 6C, a web stacked sheet 23 having a sheet shape is produced. The number of stacking of the web stacked sheet 23 is, for example, 5 layers or more, preferably 10 layers or more, and for example, 1000 layers or less, preferably 500 layers or less. The web stacked sheet 23 has a thickness of, for example, 0.01 µm or more, preferably 5 µm or more, and for example, 500 µm or less, preferably 200 µm or less.

Preferably, the above-described volatile liquid is supplied to the CNT web 24 and/or web stacked sheet 23.

Examples of the volatile liquid include, preferably organic solvent, more preferably, lower alcohols, particularly preferably, ethanol is used. Such a volatile liquid can be used singly, or can be used in combination of two or more. The volatile liquid may include metal particles.

To supply the volatile liquid to the CNT web 24, for example, as shown in FIG. 6B, while rotating the roller 26, a volatile liquid is sequentially sprayed with a spraying device 27 over the CNT web 24 wound around the circumferential face of the roller 26. The CNT web 24 can also be allowed to pass through the volatile liquid between the growth substrate 15 and the roller 26.

To supply the volatile liquid to the web stacked sheet 23, a volatile liquid can be sprayed over the web stacked sheet 23, or the web stacked sheet 23 can be immersed in the volatile liquid.

Then, by vaporizing the volatile liquid, the density of the CNT single yarns 25 improves. In the web stacked sheet 23, the stacked CNT web 24 is densified in the thickness direction.

With such a second embodiment also achieves the same operations and effects as the above-described first embodiment.

Third Embodiment

Figure 7A:
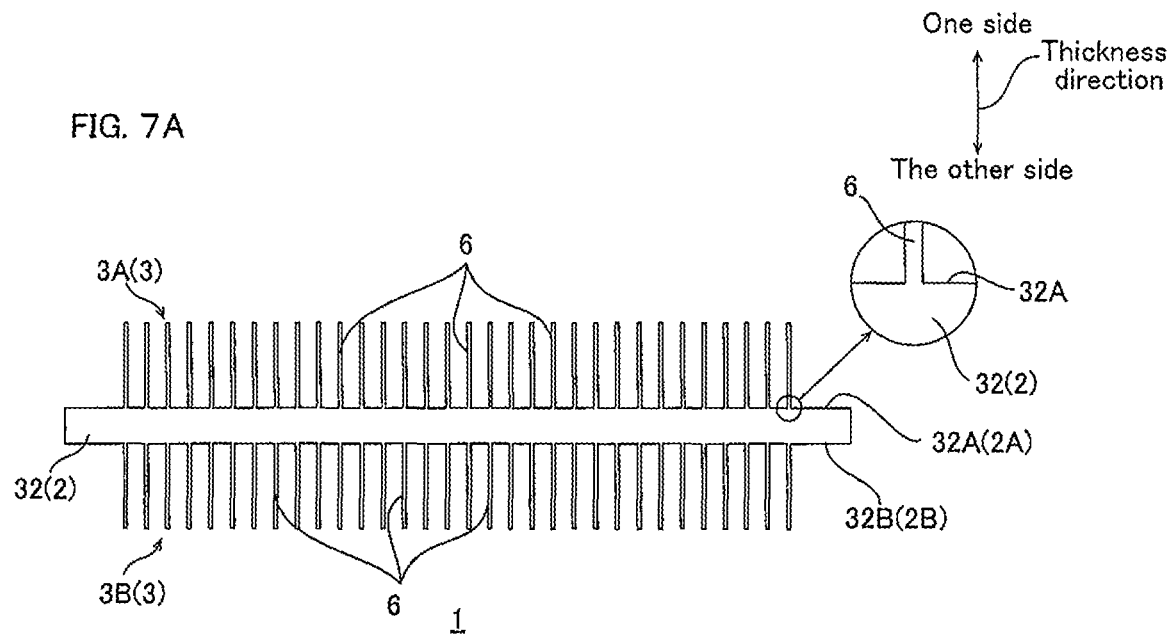
FIG. 7A is a side view of the thermal conductive sheet as a third embodiment of the carbon nanotube composite material of the present invention.
Figure 7B:
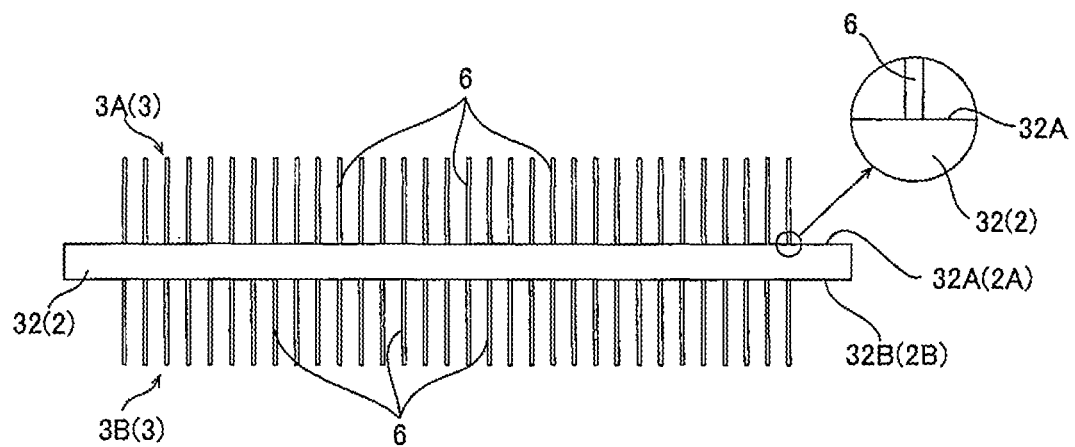
FIG. 7B illustrates an embodiment of the method for producing the thermal conductive sheet shown in FIG. 7A.

Next, description is given as to the third embodiment of the present invention with reference to FIG. 7A and FIG. 7B. In the third embodiment, the same reference numerals are given to those members that are the same as those in the first embodiment, and description thereof is omitted.

In the third embodiment, the fixture sheet 2 includes, as shown in FIG. 7A, the conductive layer 32 having electro-conductivity is included. To be more specific, the fixture sheet 2 is composed only of the conductive layer 32, and the thermal conductive sheet 1 includes a conductive layer 32 (fixture sheet 2), and two CNT array sheets 3.

Examples of the conductive layer 32 include the above-described metal sheet of the substrate 4, and preferably, an iron sheet formed from iron, and titanium sheet formed from titanium are used. The conductive layer 32 preferably has flexibility. The thickness range of the conductive layer 32 is, for example, the same as that of the above-described substrate 4.

The two CNT array sheets 3 are disposed so that one of them is disposed on the front face 32A and the other is disposed on the back face 32B of the conductive layer 32 so as to sandwich the conductive layer 32 in the thickness direction. The conductive layer 32-side end portion of the CNT array sheet 3 is bonded to the interface of the conductive layer 32.

To be more specific, the first CNT array sheet 3A is disposed on the front face 32A of the conductive layer 32, and the other side end portion of the first CNT array sheet 3A is bonded to the front face 32A of the conductive layer 32. The second CNT array sheet 3B is disposed on the back face 32B of the conductive layer 32, and the one side end portion of the second CNT array sheet 3B is bonded to the back face 32B of the conductive layer 32.

In the third embodiment, the fixture sheet 2 consists of the conductive layer 32, and therefore the front face 32A of the conductive layer 32 correspond to the front face 2A of the fixture sheet 2, and the back face 32B of the conductive layer 32 correspond to the back face 2B of the fixture sheet 2.

To produce such a thermal conductive sheet 1, first, as shown in FIG. 7B, the conductive layer 32 is prepared (conductive layer preparation step).

Then, on one side of the CNT array sheet 3 prepared in the same manner as in the above-described first embodiment, metal forming the conductive layer 32 is vapor deposited by a known method.

Then, the CNT array sheet 3 is disposed on both of the front face 32A and the back face 32B of the conductive layer 32 so that the metal vapor deposited face of the CNT array sheet 3 is brought into contact with the conductive layer 32 (disposing step).

Then, the conductive layer 32 on which the CNT array sheet 3 is disposed is heated (heating step).

The heating temperature is, for example, 300° C. or more, preferably 500° C. or more, and for example, 2500° C. or less, preferably 2000° C. or less. The heating time is, for example, 1 minute or more, and for example, 60 minutes or less, preferably 30 minutes or less.

In this manner, diffused bonding is caused between the CNT 6 of the CNT array sheet 3 and the conductive layer 32.

Such a heating step is preferably conducted under vacuum or an inert gas atmosphere.

In the heating step, as necessary, the CNT array sheet 3 is pressed to face the conductive layer 32 from outside to inside in the thickness direction. The pressure range is the same as the pressure range described above. In this manner, the CNT 6 of the CNT array sheet 3 is brought into contact with the interface of the conductive layer 32 reliably, allowing reliable bonding between the CNT 6 and the conductive layer 32.

In the above-described manner, the end portion of the CNT array sheet 3 (CNT 6) is bonded to the interface of the conductive layer 32 of the CNT array sheet 3, and supported by the conductive layer 32.

Such a thermal conductive sheet 1 has an electric resistance (conductive resistance) range in the thickness direction of the same as that of the electric resistance of the thermal conductive sheet 1 when the substrate 4 is a conductive substrate. The thermal conductive sheet 1 has a thermal conductivity range of the same as the thermal conductive range of the above-described thermal conductive sheet 1.

With such a third embodiment, the end portion of the CNT array sheet 3 (CNT 6) is bonded to the interface of the conductive layer 32, and therefore the CNT 6 of the CNT array sheet 3 can be reliably suppressed from dropping from the conductive layer 32, and thermal conductivity of the thermal conductive sheet 1 can be reliably improved, and electroconductivity can be given to the thermal conductive sheet 1.

The CNT array sheet 3 removed from the growth substrate 15 is disposed on both sides of the fixture sheet 2, and thereafter heated, the conductive layer 32-side end portion of the CNT array sheet 3 is bonded to the interface of the conductive layer 32. Therefore, with an easy method, a thermal conductive sheet 1 in which the conductive layer 32-side end portion of the CNT array sheet 3 is bonded to the interface of the conductive layer 32 can be produced.

Such a third embodiment also achieves the same operations and effects as the above-described first embodiment.

Fourth Embodiment

Next, description is given as to the fourth embodiment of the present invention with reference to FIG. 8A to FIG. 9B. In the fourth embodiment, the same reference numerals are given to those members that are the same as those in the first embodiment, and description thereof is omitted.

Figure 8A:
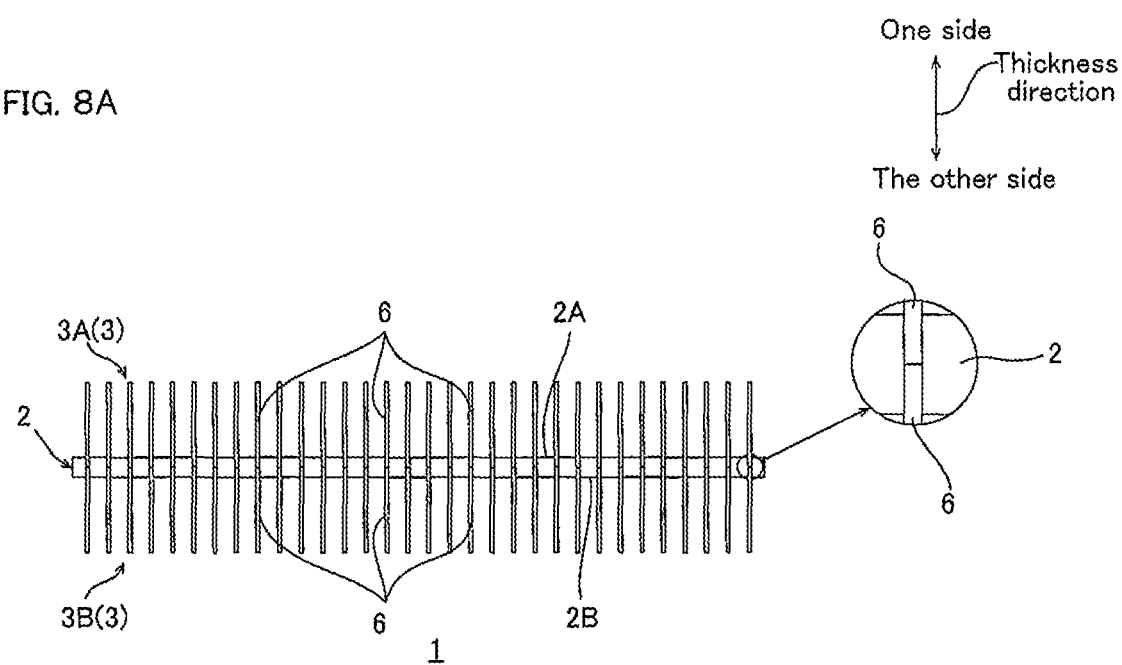
FIG. 8A is a side view of the thermal conductive sheet as a fourth embodiment of the carbon nanotube composite material of the present invention.
Figure 9A:
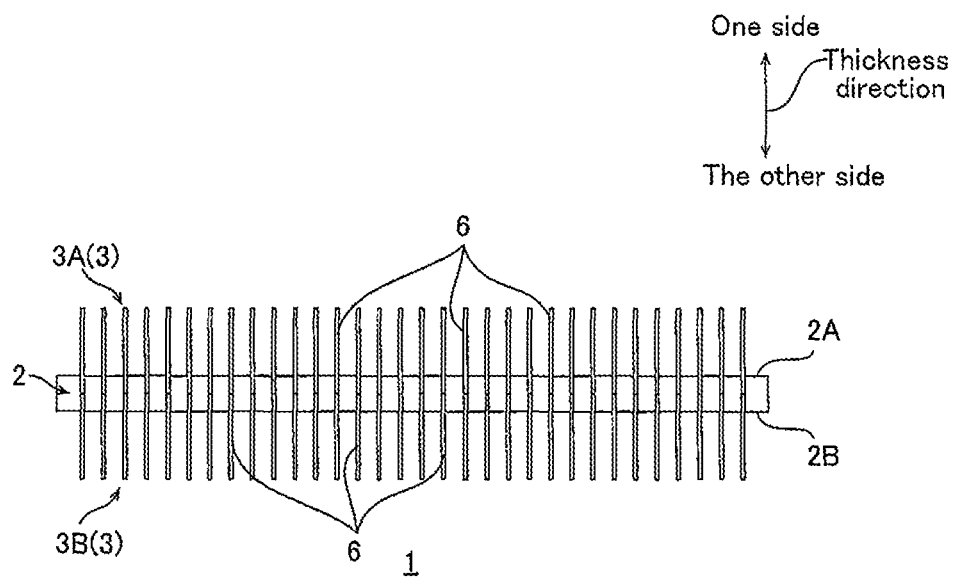
FIG. 9A is a side view of a thermal conductive sheet as a modified example of the fourth embodiment of the carbon nanotube composite material of the present invention.
Figure 9B:
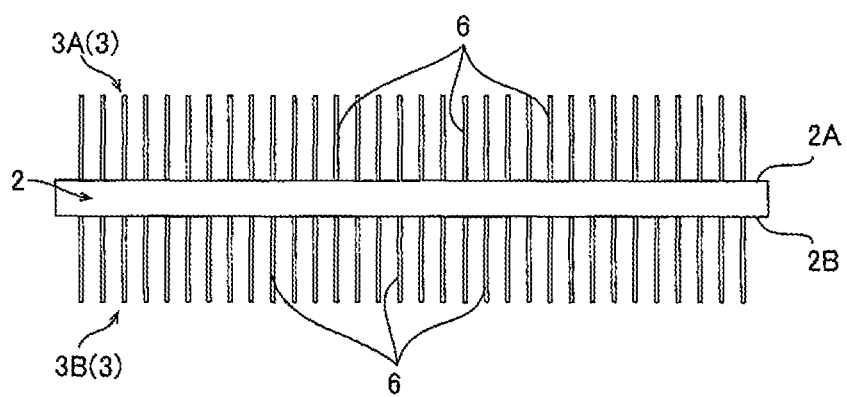
FIG. 9B illustrates an embodiment of the method for producing the thermal conductive sheet shown in FIG. 9A.

In the fourth embodiment, as shown in FIG. 8A and FIG. 9A, the first CNT array sheet 3A (front side CNT array sheet 3) and the second CNT array sheet 3B (back side CNT array sheet 3) are in contact with each other in the fixture sheet 2.

The fixture sheet 2 is formed from metal or resin material.

Examples of the metal include metals forming the metal sheet of the above-described substrate 4, and preferably, iron and titanium, and in view of compatibility with the CNT, more preferably, titanium is used. Examples of the resin material include the resin material forming the above-described resin layer 5, and preferably, thermoplastic resin is used.

The fixture sheet 2 preferably has flexibility. The fixture sheet 2 has a thickness range of, for example, the same as the thickness range of the above-described substrate 4.

The other side end portion of the first CNT array sheet 3A is embedded in the front face 2A of the fixture sheet 2, and this allows the first CNT array sheet 3A to be supported by the fixture sheet 2. One side end portion of the second CNT array sheet 3B is embedded in the back face 2B of the fixture sheet 2, and this allows the second CNT array sheet 3B to be supported by the fixture sheet 2. Then, the other side end portion of the first CNT array sheet 3A, and one side end portion of the second CNT array sheet 3B are in contact with each other in the fixture sheet 2.

To produce such a thermal conductive sheet 1, for example, when the fixture sheet 2 is formed from metal, first, a paste containing metal particles is prepared (paste preparation step).

To prepare the paste, the metal particles are dispersed in a resin solution.

The metal particles are particles formed from the above-described metal, and its average primary particle size is, for example, 0.1 μm or more, preferably 1 μm or more, and for example, 30 μm or less, preferably 10 μm or less. The metal particles content relative to the total amount of the paste is, for example, 5 mass % or more, preferably 10 mass % or more, and for example, 50 mass % or less, preferably 30 mass % or less.

The resin solution is a solution in which the above-described resin material is dissolved in a solvent (for example, water, organic solvent, etc.). For the resin material, preferably, thermoplastic resin, more preferably, PVA is used.

Figure 8B:
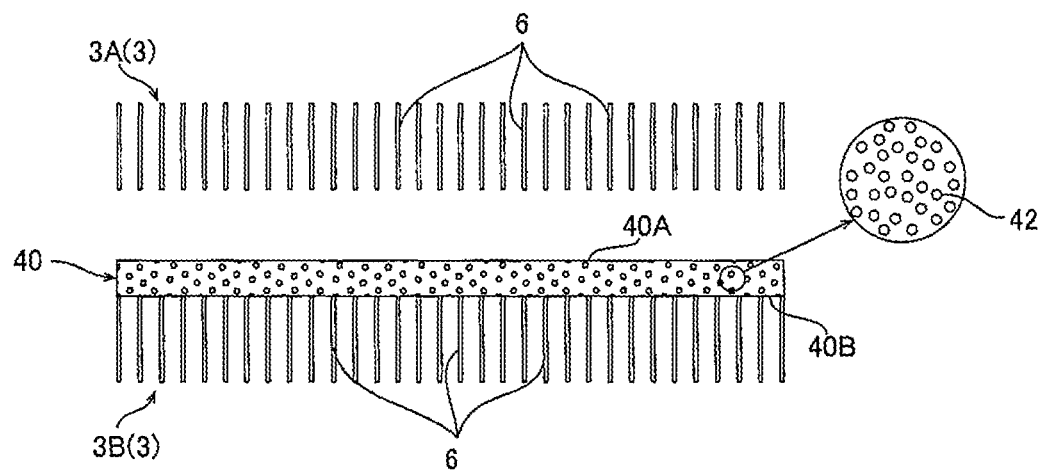
FIG. 8B illustrates an embodiment of the method for producing the thermal conductive sheet shown in FIG. 8A, showing a step of forming a particle-containing layer on the CNT array sheet.

Then, as shown in FIG. 8B, the paste is applied on one side in the thickness direction of second CNT array sheet 3B(CNT array sheet 3) prepared in the same manner as in the above-described first embodiment, to form a particle-containing layer 40. Therefore, the particle-containing layer 40 contains metal particles. In FIG. 8B, the metal particles contained in the particle-containing layer 40 are shown as metal particles 42.

The particle-containing layer 40 has a thickness of, for example, 10 µm or more, preferably 20 µm or more, and for example, 50 µm or less, preferably 40 µm or less.

Figure 8C:
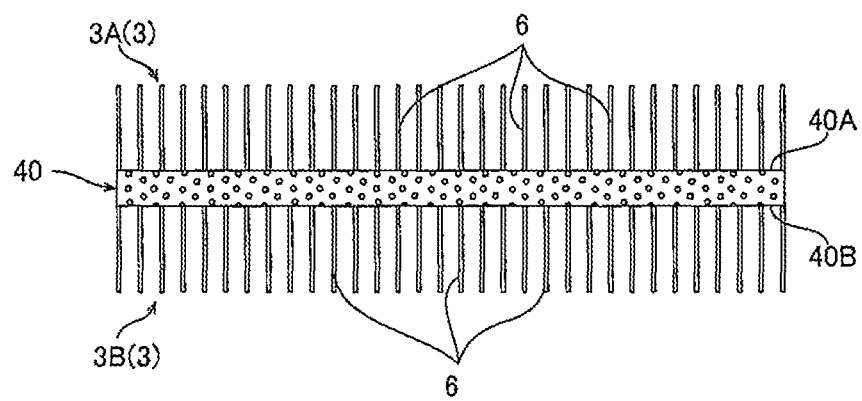
FIG. 8C shows, following FIG. 8B, a step of disposing the CNT array sheet on both front and back sides of the particle-containing layer.

Then, as shown in FIG. 8C, the first CNT array sheet 3A (CNT array sheet 3) is disposed on the front face 40A (one side face in thickness direction) of the particle-containing layer 40.

In this manner, the particle-containing layer 40 is sandwiched between the first CNT array sheet 3A and the second CNT array sheet 3B. In other words, the CNT array sheet 3 (first CNT array sheet 3A and second CNT array sheet 3B) is disposed on both sides of the front face 40A and the back face 40B of the particle-containing layer 40.

Then, the particle-containing layer 40 on which the CNT array sheet 3 is disposed is heated (heating step).

The heating temperature is, the melting point of the metal particles or more, and the less than the sublimation temperature of the CNT 6, and for example, 1000° C. or more, preferably 1500° C. or more, and for example, 2500° C. or less, preferably 2000° C. or less. The heating time is, for example, 1 minute or more, preferably 10 minutes or more, and for example, 60 minutes or less, preferably 30 minutes or less.

Then, the resin material contained in the particle-containing layer 40 is burned, and the metal particles 42 melt to goes between the plurality of CNTs 6 of the CNT array sheet 3.

In this manner, the fixture sheet 2 composed of metal is formed, the first CNT array sheet 3A (front side CNT array sheet 3) and the second CNT array sheet 3B (back side CNT array sheet 3) are embedded in the fixture sheet 2, and brought into contact with each other in the fixture sheet 2.

Such a heating step is preferably performed under vacuum, or in an inert gas atmosphere.

In the heating step, as necessary, the first CNT array sheet 3A and the second CNT array sheet 3B are pressed from outside in the thickness direction to the inside so that they are closer. The pressure range is the same as the above-described pressure range. In this manner, the first CNT array sheet 3A and the second CNT array sheet 3B can be reliably brought into contact with each other in the fixture sheet 2.

When the fixture sheet 2 is formed from resin material, particularly thermoplastic resin, to produce the thermal conductive sheet 1, for example, the CNT array sheet 3 prepared in the same manner as in the above-described first embodiment is disposed on both of the front face 2A and the back face 2B of the fixture sheet 2 (disposing step). Then, the fixture sheet 2 on which the CNT array sheet 3 is disposed is heated (heating step).

The heating temperature is the softening point of the thermoplastic resin or more, and less than the temperature that burns the thermoplastic resin, and for example, 300° C. or more and 400° C. or less. The heating time is, for example, 1 minute or more, and for example, 30 minutes or less, preferably 10 minutes or less.

In this manner, the fixture sheet 2 melts and the thermoplastic resin goes between the plurality of CNTs 6 of the array sheet 3.

In this manner, the first CNT array sheet 3A (front side CNT array sheet 3) and the second CNT array sheet 3B (back side CNT array sheet 3) are embedded in the fixture sheet 2, and brought into contact with each other in the fixture sheet 2.

Such a thermal conductive sheet 1 has an electric resistance (conductive resistance) in the thickness direction in the range of, the same as the electric resistance range of the thermal conductive sheet 1 when the above-described substrate 4 is a conductive substrate. The range of the thermal conductivity of the thermal conductive sheet 1 is the same as the range of the thermal conductivity of the thermal conductive sheet 1.

With the fourth embodiment, as shown in FIG. 8A and FIG. 9A, the first CNT array sheet 3A and the second CNT array sheet 3B are in contact with each other in the fixture sheet 2, and therefore the CNT 6 of the CNT array sheet 3 can be reliably suppressed from dropping from the fixture sheet 2, and the thermal conductivity of the thermal conductive sheet 1 can be reliably improved.

When the fixture sheet 2 is formed from metal, the CNT array sheet 3 removed from the growth substrate 15 is disposed on both sides of the particle-containing layer 40, and thereafter heated, and the first CNT array sheet 3A and the second CNT array sheet 3B are embedded in the fixture sheet 2, and are brought into contact with each other in the fixture sheet 2.

When the fixture sheet 2 is formed from thermoplastic resin, the CNT array sheet 3 removed from the growth substrate 15 is disposed on both sides of the fixture sheet 2, and thereafter heated to embed the first CNT array sheet 3A and the second CNT array sheet 3B in the fixture sheet 2 and to bring into contact with each other in the fixture sheet 2.

Therefore, with an easy method, the thermal conductive sheet 1 in which the first CNT array sheet 3A and the second CNT array sheet 3B are in contact with each other in the fixture sheet 2 can be produced.

Such a fourth embodiment also achieves the same operations and effects as the above-described first embodiment. In the description above, the particle-containing layer 40 is formed by applying a paste, but it is not limited thereto, and the particle-containing layer 40 can be a resin sheet in which metal particles are dispersed.

Modified Example

In the above-described embodiment, the CNT array sheet 3 is densified by heating or supplying a liquid, but the CNT array sheet 3 densification is not limited thereto, and the CNT array sheet 3 can be densified by mechanical compression.

Figure 10A:
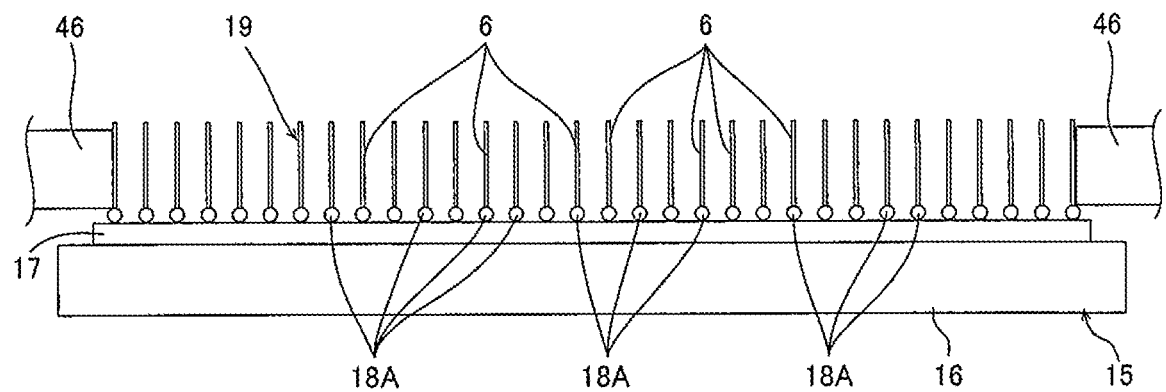
FIG. 10A illustrates a step of mechanically densifying the VACNTs shown in FIG. 2C, showing a step of disposing pressing plates so as to sandwich the VACNTs.
Figure 10B:
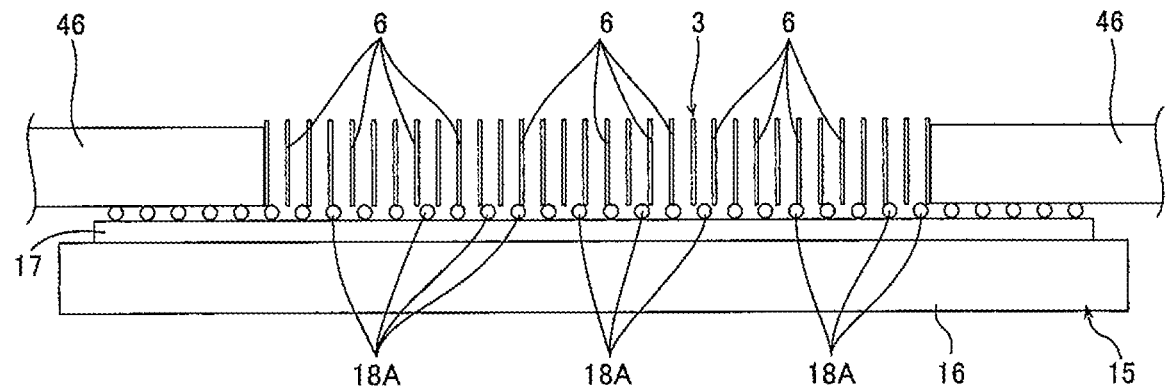
FIG. 10B shows, following FIG. 10A, a step of compressing the VACNTs with the pressing plates.

For example, as shown in FIG. 10A and FIG. 10B, the VACNTs 19 on the growth substrate 15 are compressed by two pressing plates 46 to prepare a densified CNT array sheet 3.

To be more specific, the two pressing plates 46 are disposed so as to sandwich the VACNTs 19, and thereafter they are slid closer to compress the VACNTs 19. Then, the plurality of CNTs 6 of the VACNTs 19 are separated from the corresponding granular body 18A, and compressed to be brought into contact with each other.

The VACNTs 19 can be separated from the growth substrate 15 in this manner as well, and the densified CNT array sheet 3 can be prepared.

In the above-described embodiment, the substrate 4 has a sheet shape (film shape), but it is not limited thereto, and it can be a flat plate shape. Examples of the flat plate shape substrate 4 include metal plate, ceramic plate, graphite plate, carbon nanotube collected product, and resin sheet containing conductive particles.

These first embodiment to fourth embodiment, and modified example can be suitably combined.

<Second Invention>

Next, description is given as to the second invention with reference to FIG. 11 to FIG. 18C. In the second invention, the same members as those in the above-described first invention are given the same reference numerals, and description thereof is omitted.

The carbon nanotube composite material of the second invention includes a substrate, a vertically-aligned carbon nanotube disposed on the substrate, and an adhesion layer that allows the vertically-aligned carbon nanotube to adhere to the substrate.

In the following, a carbon nanotube composite material 50 (hereinafter referred to as CNT composite material 50) as the fifth embodiment of the carbon nanotube composite material of the second invention is described.

Fifth Embodiment (1) Configuration of Carbon Nanotube Composite Material

Figure 11:
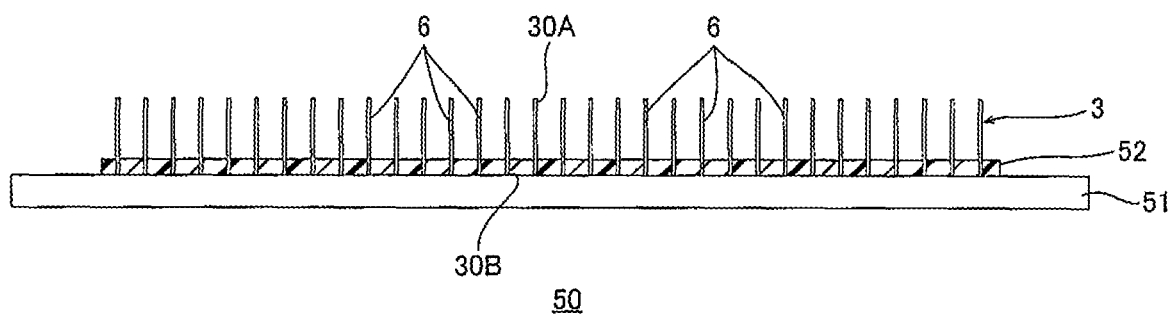
FIG. 11 is a side view of the carbon nanotube composite material (CNT composite material) of the second invention in the fifth embodiment.

As shown in FIG. 11, the CNT composite material 50 includes a substrate 51, CNT array sheet 3, and adhesion layer 52.

The substrate 51 has a sheet shape (film shape). The substrate 51 has a predetermined thickness, extends in the surface direction orthogonal to its thickness direction (vertical direction and lateral direction), and has a flat front side (one side in thickness direction) and a flat back face (the other side in thickness direction). The thickness range of the substrate 51 is the same as the thickness range of the above-described substrate 4.

Examples of the substrate 51 include the conductive substrates and insulative substrates given as examples of the substrate 4 described above. Of the examples of the substrate 51, preferably, the above-described metal sheet and the above-described plastic plate are used, more preferably, a metal sheet formed from aluminum, and a plastic plate formed from an engineering plastics, particularly preferably, a metal sheet formed from aluminum is used.

The CNT array sheet 3 is disposed on the substrate 51, to be specific, on the surface (one side in thickness direction) of the substrate 51. The CNT array sheet 3 is VACNTs 19 removed from the growth substrate 15, as shown in FIG. 3A and FIG. 3B. The CNT array sheet 3 is formed into a sheet shape from the plurality of CNTs 6. As shown in FIG. 11, the plurality of CNTs 6 of the CNT array sheet 3 are aligned (vertically aligned) to be orthogonal to the substrate 51. The CNT array sheet 3 has one end portion 30A, and the other end portion 30B opposite to the one end portion 30A in the thickness direction of the CNT array sheet 3 (hereinafter referred to as thickness direction).

The adhesion layer 52 allows the CNT array sheet 3 to adhere to the substrate 51. To be specific, the adhesion layer 52 allows the other end portion 30B of the CNT array sheet 3 to be embedded, and allows the CNT array sheet 3 to adhere to the substrate 51. That is, the other end portion 30B of the CNT array sheet 3 is embedded in the adhesion layer 52, and the adhesion layer 52 is disposed on the surface of the substrate 51. The other end portion 30B of the CNT array sheet 3 is preferably in contact with the substrate 51.

The adhesion layer 52 has a thickness of, for example, 5 μm or more, preferably 20 μm or more, and for example, 50 μm or less, preferably 30 μm or less. The adhesion layer 52 has a thickness of, when the thickness of the CNT array sheet 3 is 100, for example, 10 or more, preferably 25 or more, and for example, 50 or less, preferably 30 or less.

The adhesion layer 52 is formed from, for example, resin materials given as examples of the materials of the resin layer 5 described above. For the resin material, preferably, the above-described thermosetting resin and thermoplastic resin are used.

Figure 12A:
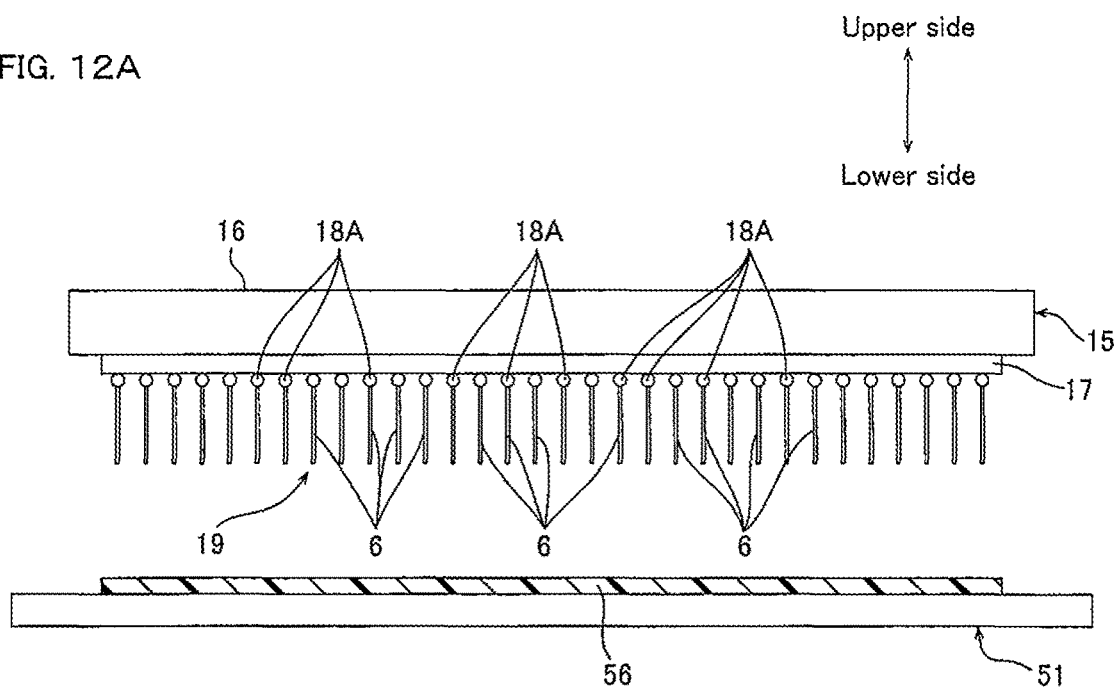
FIG. 12A illustrates a method for producing the CNT composite material of the second invention in the fifth embodiment, showing a step of embedding the VACNTs in a first resin composition layer. Following FIG. 12A.
Figure 12B:
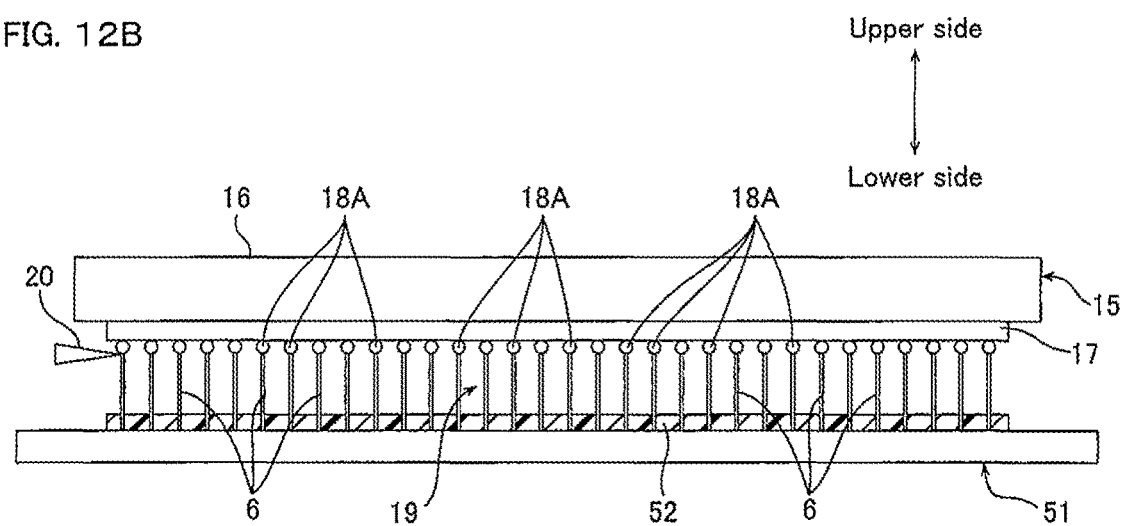
FIG. 12B illustrates a step of curing the first resin composition layer to form a first adhesion layer. Following FIG. 12B.
Figure 12C:
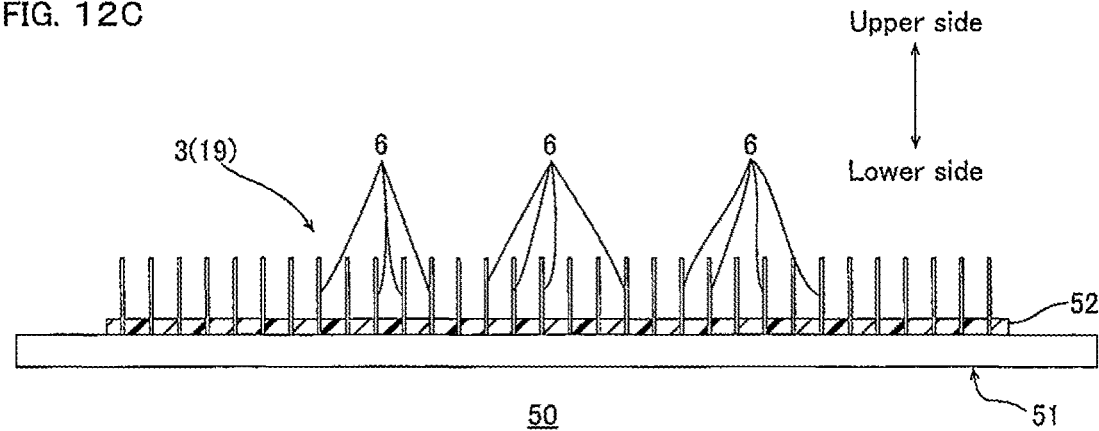
FIG. 12C illustrates a step of removing the growth substrate from the VACNTs.

(2) Method for Producing a CNT Composite Material Including an Adhesion Layer Formed from Thermosetting Resin Next, description is given as to a method for producing a CNT composite material 50 including an adhesion layer 52 formed from thermosetting resin with reference to FIG. 12A to FIG. 12C.

For the thermosetting resin forming the adhesion layer 52, preferably, epoxy resin and fluorine rubber are used.

When the adhesion layer 52 is formed from thermosetting resin, compared with the case where the CNT array sheet 3 allowed to adhere to the substrate 51 with thermoplastic resin, disorganized alignment of the CNT array sheet 3 is suppressed, and contact between the CNT array sheet 3 and the substrate 51 can be stably secured.

To produce the CNT composite material 50 including the adhesion layer 52 formed from thermosetting resin, as shown in FIG. 12A, first, the substrate 51 is prepared. Then, as necessary, the surface (upper face) of the substrate 51 is subjected to surface treatment with, for example, UV irradiation and surface abrasion.

Then, on the substrate 51, an A-stage or B-stage resin composition layer 56 composed of thermosetting resin composition is formed. The thermosetting resin composition is a resin composition that forms the above-described thermosetting resin by going through complete curing.

The A-stage resin composition layer 56 is formed on the substrate 51 by, applying varnish composed of, for example, A-stage (liquid) thermosetting resin composition on the upper face of the substrate 51 by a known method to form the A-stage resin composition layer 56.

The varnish composed of the A-stage thermosetting resin composition contains, for example, a polymerization component that forms the above-described thermosetting resin by polymerization, and an organic solvent that dissolves the polymerization component.

Examples of the organic solvent include the organic solvents given as examples of the above-described volatile liquid. The organic solvent can be used singly, or can be used in combination of two or more. Of the examples of the organic solvent, preferably, polar aprotic solvents, more preferably, N-methylpyrrolidone is used.

The B-stage resin composition layer 56 can be formed on the upper face of the substrate 51 by, for example, first, a prepreg sheet composed of the B-stage (semi-cured) thermosetting resin composition is prepared.

For the prepreg sheet, for example, a commercially available product can be used.

Then, the prepreg sheet is bonded to the upper face of the substrate 51 to form the B-stage resin composition layer 56.

In this manner, the resin composition layer 56 is formed on the upper face of the substrate 51. The thickness of the resin composition layer 56 is suitably changed in accordance with the length of the CNT 6.

Then, as shown in FIG. 2A to FIG. 2C, in the same manner as in the above-described CNT growth step, VACNTs 19 is allowed to grow on the growth substrate 15.

Then, as shown in FIG. 12A, the growth substrate 15 on which the VACNTs 19 grow is disposed so that the VACNTs 19 is at the lower side and the growth substrate 15 is at the upper side. Then, the VACNTs 19 is allowed to face the resin composition layer 56 in spaced apart relation at the upper side.

Then, as shown in FIG. 12B, the growth substrate 15 on which the VACNTs 19 grow is descended to embed the VACNTs 19 in the resin composition layer 56. That is, the VACNTs 19 is embedded in the resin composition layer 56 without removing the growth substrate 15. In this manner, compared with the case where the VACNTs 19 (CNT array sheet 3) removed from the growth substrate 15 is embedded in the resin composition layer 56, disorganized alignment of the VACNTs 19 can be suppressed.

Furthermore, when the VACNTs 19 is embedded in the resin composition layer 56, preferably, the VACNTs 19 is brought into contact with the substrate 51.

The VACNTs 19 is embedded in the resin composition layer 56 at a temperature of, for example, 50° C. or more, and for example, 100° C. or less, preferably 70° C. or less.

Then, the resin composition layer 56 is heated and cured.

The heating temperature of the resin composition layer 56 is suitably changed in accordance with the type of the selected thermosetting resin, and for example, 120° C. or more, preferably 150° C. or more, and for example, 400° C. or less, preferably 200° C. or less.

The heating time of the resin composition layer 56 is, for example, 20 minutes or more, preferably 1 hour or more.

In the step of curing the resin composition layer 56, preferably, the VACNTs 19 is pressed against the lower side with the growth substrate 15 interposed therebetween so that the VACNTs 19 face the substrate 51.

The pressure to the VACNTs 19 is, for example, 1 kPa or more, preferably 4 kPa or more, more preferably 10 kPa or more.

In the fifth embodiment, as shown in FIG. 12A and FIG. 12B, when the resin composition layer 56 is cured, the resin composition layer 56 is positioned at the upper side of the substrate 51, and the VACNTs 19 are embedded in the resin composition layer 56 from the upper side. Therefore, the resin composition layer 56 contacts closely with the weight of the substrate 51 itself. As a result, separation of the resin composition layer 56 from the substrate 51 can be suppressed, and contact failure between the VACNTs 19 and the substrate 51 can be suppressed.

In the above-described manner, the resin composition layer 56 is completely cured to form the adhesion layer 52 that allows the VACNTs 19 to adhere to the substrate 51.

Then, as shown in FIG. 12B, the growth substrate 15 is removed from the VACNTs 19.

To remove the growth substrate 15 from the VACNTs 19, for example, the above-described cutting blade 20 is shifted by sliding along the growth substrate 15 to cut the upper end portion (growth substrate 15 side end portion) of the plurality of CNTs 6. Thereafter, growth substrate 15 is removed from the VACNTs 19. The VACNTs 19 is removed from the growth substrate 15 to form a CNT array sheet 3.

By removing the growth substrate 15 from the VACNTs 19 after curing the resin composition layer 56 in the above-described manner, compared with the case where the growth substrate 15 is removed from the VACNTs 19 before curing the resin composition layer 56, disorganized alignment of the VACNTs 19 can be suppressed.

In the above-described manner, a CNT composite material 50 including an adhesion layer 52 formed from thermosetting resin can be produced.

(3) Method for Producing a CNT Composite Material Including Adhesion Layer Formed from Thermoplastic Resin Next, description is given as to a method for producing a CNT composite material 50 including adhesion layer 52 formed from thermoplastic resin.

Of the thermoplastic resin forming the adhesion layer 52, preferably, fluorine polymer (for example, polytetrafluoroethylene (PTFE), per fluoroalkoxyalkane (PFA), polyvinyl fluoride, polyvinylidene fluoride, etc.) is used.

When the adhesion layer 52 is formed from thermoplastic resin (particularly fluorine polymer), the CNT array sheet 3 can be adhered to the substrate 51 stably, and heat resistance, oil resistance, and chemical resistance of the adhesion layer 52 can be improved.

To produce the CNT composite material 50 including an adhesion layer 52 formed from thermoplastic resin (particularly fluorine polymer), first, a substrate 51 is prepared in the same manner as in the above, and an adhesion layer 52 formed from thermoplastic resin (particularly fluorine polymer) is formed on the substrate 51.

The adhesion layer 52 can be formed on the substrate 51 without particular limitation, and for example, the above-described thermoplastic resin can be applied on the substrate 51 to form the adhesion layer 52, or a resin sheet formed from the above-described thermoplastic resin is prepared, and can disposed on the substrate 51.

Then, a growth substrate 15 on which the VACNTs 19 grow is disposed so that the VACNTs 19 is at the lower side and the growth substrate 15 is at the upper side. Then, the VACNTs 19 is allowed to face the adhesion layer 52 at the upper side in spaced apart relation.

Then, the adhesion layer 52 is heated to melt the adhesion layer 52. The heating temperature range of the adhesion layer 52 is the same as the heating temperature range of the above-described resin layer 5.

Then, the growth substrate 15 is descended to embed the VACNTs 19 in the adhesion layer 52. At this time, preferably, the VACNTs 19 is pressed toward the lower side so that the VACNTs 19 faces the substrate 51 with the above-described pressure range. The VACNTs 19 preferably penetrate the adhesion layer 52 to be brought into contact with the substrate 51.

By cooling thereafter, the melted adhesion layer 52 is hardened while in close contact with the substrate 51 and the VACNTs 19. In this manner, the adhesion layer 52 allows the VACNTs 19 to adhere to the substrate 51.

Then, in the same manner as described above, the growth substrate 15 is removed from the VACNTs 19 to form the CNT array sheet 3 from the VACNTs 19.

In the above-described manner, the CNT composite material 50 including the adhesion layer 52 formed from the thermoplastic resin (particularly fluorine polymer) is produced.

(4) Characteristics and Use of the CNT Composite Material

Regardless of the fact that the adhesion layer 52 is formed from resin material of thermosetting resin or thermoplastic resin, the electric resistance (conductive resistance) in the thickness direction of the CNT composite material 50 is in the same range as that of the electric resistance (conductive resistance) in the thickness direction of the thermal conductive sheet 1. The thermal conductivity in the thickness direction of the CNT composite material 50 is in the same range as that of the thermal conductivity in the thickness direction of the thermal conductive sheet 1.

The such a CNT composite material 50 can be suitably used as, for example, a vibration isolator, heat insulating material, and thermal conductive sheet.

(5) Operations and Effects

In the fifth embodiment, as shown in FIG. 11, the adhesion layer 52 allows the CNT array sheet 3 (VACNTs 19) to adhere to the substrate 51, and therefore the CNT 6 of the CNT array sheet 3 can be suppressed from dropping from the substrate 51.

When the adhesion layer 52 is formed from the thermosetting resin, compared with the case where the CNT array sheet 3 is allowed to adhere to the substrate 51 with thermoplastic resin, disorganized alignment of the CNT array sheet 3 can be suppressed, and contact between the CNT array sheet 3 and the substrate 51 can be stably secured.

For example, Japanese Unexamined Patent publication 2011-222746 discloses an electronic device including a TIM, heating element, and heat release element, wherein the TIM include a plurality of carbon nanotubes, a first thermoplastic resin layer that allows the carbon nanotube to adhere to the heating element, and a second thermoplastic resin layer that allows the carbon nanotube to adhere to the heat release element.

To produce such an electronic device, first, the first thermoplastic resin layer is formed on the surface of the heating element, and thereafter the heating element is disposed so that the first thermoplastic resin layer faces the carbon nanotube. Then, the second thermoplastic resin layer is formed on the surface of the heat release element, and the heat release element is disposed so that the second thermoplastic resin layer faces the carbon nanotube. Then, heating is conducted while load is applied to the heating element and heat release element to melt the two thermoplastic resin layers, and thereafter cooling is conducted to allow the carbon nanotube to adhere to the heating element and heat release element. In this manner, an electronic device is produced.

However, with the electronic device described in Japanese Unexamined Patent Publication No. 2011-222746, the two thermoplastic resin layers are melted by heating and thereafter cooled so that the carbon nanotube, heating element, and heat release element are allowed to adhere to each other. Therefore when melting of the thermoplastic resin layer is insufficient, stable contact between the carbon nanotube, heating element, and heat release element may not be secured.

Meanwhile, when the temperature for the heat treatment is increased for sufficiently melting the thermoplastic resin layer, disorganized alignment of the carbon nanotube may be caused, for example, the carbon nanotube may be partially concentrated.

In these cases, the characteristics of the carbon nanotube (for example, thermal conductivity, etc.) may not be exhibited sufficiently, and there may be disadvantages in that thermal conductive performance of the TIM may be reduced.

On the other hand, when the adhesion layer 52 is formed from thermosetting resin, as shown in FIG. 12A to FIG. 12C, the A-stage or B-stage resin composition layer 56 composed of thermosetting resin composition is formed on the substrate 51, and thereafter the CNT array sheet 3 is embedded in the resin composition layer, and the resin composition layer is heated and cured to allow the CNT array sheet 3 to adhere to the substrate 51.

That is, the CNT array sheet 3 is embedded in the A-stage or B-stage resin composition layer 56, and therefore the CNT array sheet 3 does not have to be heated when embedded in the resin composition layer 56. Therefore, compared with the case where the CNT array sheet 3 is embedded in the thermoplastic resin layer melted by heating, disorganized alignment of the CNT array sheet 3 can be suppressed, and contact between the CNT array sheet 3 and the substrate 51 can be stably secured.

Furthermore, when the adhesion layer 52 is formed from fluorine polymer, the substrate 51 and the CNT array 3 sheet can be allowed to adhere to each other stably, and heat resistance, oil resistance, and chemical resistance of the adhesion layer 52 can be improved.

In the CNT composite material 50, as shown in FIG. 12C, the growth substrate 15 is removed from the VACNTs 19, but it is not limited thereto, and the growth substrate 15 does not have to be removed from the VACNTs 19. That is, the configuration shown in FIG. 12B can be the CNT composite material 50. In this case, the CNT composite material 50 includes the VACNTs 19, growth substrate 15, first substrate 51, and first adhesion layer 52.

Sixth Embodiment

Next, description is given as to the sixth embodiment of the second invention with reference to FIG. 13 to FIG. 15B. In the sixth embodiment, the same reference numerals are given to those members that are the same as those in the fifth embodiment above, and description thereof is omitted.

(1) Configuration of Carbon Nanotube Composite Material

Figure 13:
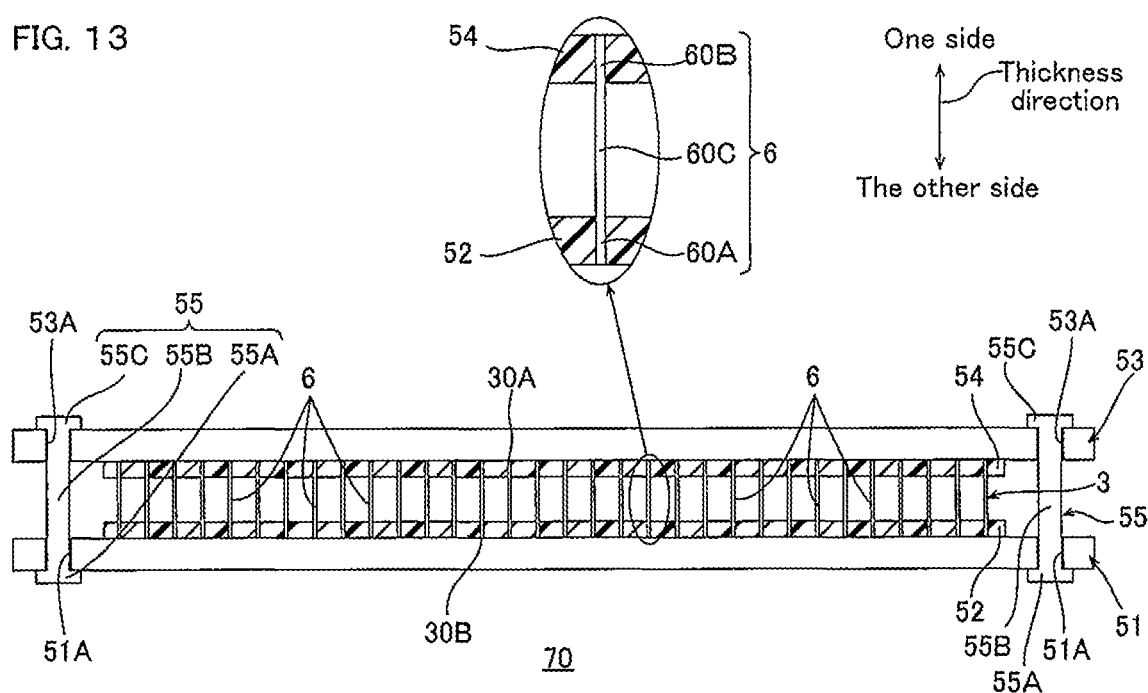
FIG. 13 is a side view of the CNT composite material of the second invention in a sixth embodiment.
Figure 14:
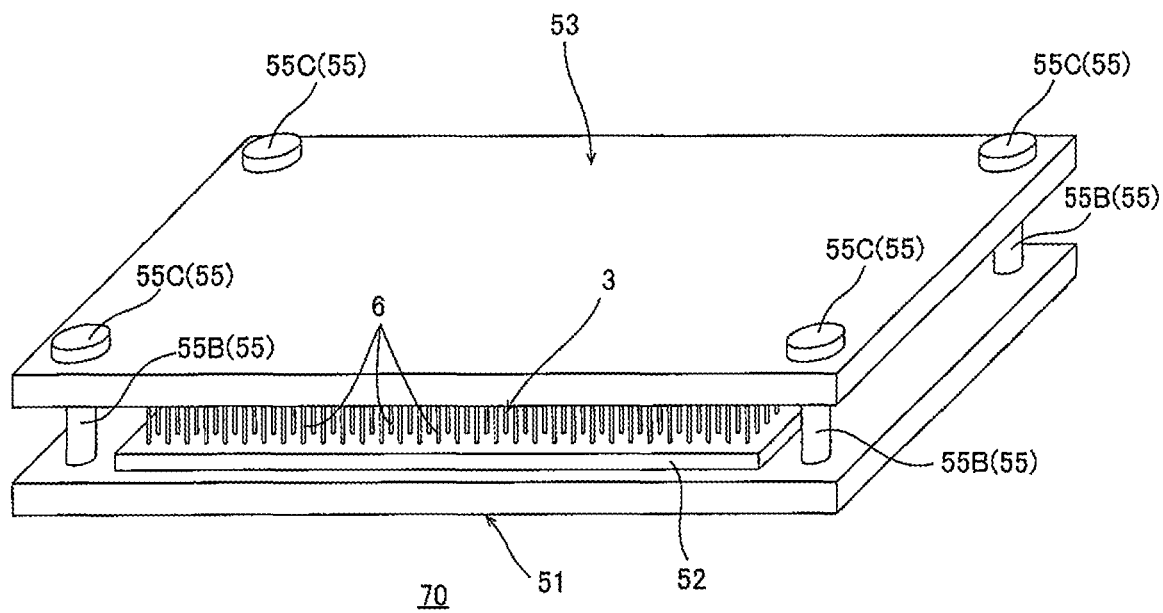
FIG. 14 is a perspective view of the CNT composite material shown in FIG. 13.

As shown in FIGS. 13 and 14, the carbon nanotube composite material 70 (hereinafter referred to as CNT composite material 70) as the sixth embodiment of the second invention includes the CNT array sheet 3, substrate 51, adhesion layer 52, second substrate 53, second adhesion layer 54, and a plurality of rivets 55 as an example of the fixing member (first fixing member). In the following, the substrate 51 is the first substrate 51 and the adhesion layer 52 is the first adhesion layer 52.

As shown in FIG. 13, the first substrate 51 has a plurality of openings 51A. The openings 51A are openings for the rivets 55 to penetrate through. The number of the plurality of openings 51A is the same as the number of the rivets 55. The openings 51A penetrate the first substrate 51 in the thickness direction of the first substrate 51. The plurality of openings 51A are disposed at the peripheral end portion of the first substrate 51, and when projected in the thickness direction, positioned so as not to overlap the CNT array sheet 3.

The second substrate 53 is disposed at the opposite side of the first substrate 51 relative to the CNT array sheet 3. That is, the CNT array sheet 3 is disposed between the first substrate 51 and the second substrate 53, and is disposed on the second substrate 53, to be specific, on the other side of the second substrate 53 in the thickness direction.

The second substrate 53 is disposed in spaced apart relation in the thickness direction relative to the first substrate 51. The distance range between the first substrate 51 and the second substrate 53 is the same as the average length range of the above-described CNT 6.

The second substrate 53 has the same configuration as that of the first substrate 51, and in the sixth embodiment, it has a sheet shape (film shape).

Examples of the second substrate 53 include, similarly to the first substrate 51, the above-described conductive substrate and insulative substrate. For the second substrate 53, a substrate that is different from the first substrate 51 can be selected, but preferably, the substrate that is the same as that of the first substrate 51 can be selected. For example, when the first substrate 51 is a metal sheet, preferably, a metal sheet is selected as the second substrate 53.

The second substrate 53 has a plurality of openings 53A. The openings 53A are the openings for the rivet 55 to penetrate through. The number of the plurality of openings 53A is the same as the number of the plurality of rivets 55. The openings 53A penetrate the second substrate 53 in the thickness direction. The openings 53A have a diameter that is the same as that of the openings 51A. The plurality of openings 53A are disposed at the peripheral end portion of the second substrate 53, and when projected in the thickness direction, are disposed so as to overlap the plurality of openings 51A.

The second adhesion layer 54 allows the CNT array sheet 3 to adhere to the second substrate 53. To be specific, one end portion 30A of the CNT array sheet 3 is embedded in the second adhesion layer 54 to allow the CNT array sheet 3 to adhere to the second substrate 53. The second adhesion layer 54 is disposed on the back face (the other side in thickness direction) of the second substrate 53 while the one end portion 30A of the CNT array sheet 3 is embedded in the second adhesion layer 54.

The second adhesion layer 54 is formed, for example, from the above-described resin material as the first adhesion layer 52. Of the resin material forming the second adhesion layer 54, preferably, thermosetting resin and thermoplastic resin are used. Of the thermosetting resin, epoxy resin and fluorine rubber are used. Of the thermoplastic resin, preferably, fluorine polymer is used.

For the resin material of the second adhesion layer 54, resin material that is difference from the first adhesion layer 52 can be selected, but preferably, the same resin material as that of the first adhesion layer 52 is selected. For example, when the first adhesion layer 52 is formed from thermosetting resin, thermosetting resin is selected as the resin material of the second adhesion layer 54, and when the first adhesion layer 52 is formed from fluorine polymer, fluorine polymer is selected as the resin material of the second adhesion layer 54. The thickness range of the second adhesion layer 54 is the same as the thickness range of the first adhesion layer 52.

One end portion 30A of the CNT array sheet 3 is embedded in the second adhesion layer 54, and the other end portion 30B of the CNT array sheet 3 is embedded in the first adhesion layer 52. One end portion 30A of the CNT array sheet 3 is preferably in contact with the second substrate 53, and the other end portion 30B of the CNT array sheet 3 is preferably in contact with the first substrate 51.

In the CNT array sheet 3, each CNT 6 has a first embedded portion 60A embedded in the first adhesion layer 52, and a second embedded portion 60B embedded in the second adhesion layer 54, and an exposed portion 60C, i.e., a portion between the first embedded portion 60A and the second embedded portion 60B.

The first embedded portion 60A preferably penetrate the first adhesion layer 52. The first embedded portion 60A has a length in the range of, for example, the same as the thickness range of the first adhesion layer 52. The ratio of the length of the first embedded portion 60A relative to the length of the CNT 6 as 100% is, for example, 10% or more, preferably 25% or more, and for example, 40% or less, preferably 30% or less.

The second embedded portion 60B preferably penetrates the second adhesion layer 54. The second embedded portion 60B has a length in the range of, for example, the same as the thickness range of the second adhesion layer 54. The ratio of the length of the second embedded portion 60B relative to the length of the CNT 6 as 100% is, for example, 10% or more, preferably 25% or more, and for example, 50% or less, preferably 30% or less.

The plurality of rivets 55 fix the first substrate 51 and the second substrate 53 from each other so as to keep the distance between the first substrate 51 and the second substrate 53. The rivet 55 includes a head portion 55A, body portion 55B, and crimp portion 55C.

The head portion 55A is provided at the other end portion of the rivet 55 in the thickness direction. The head portion 55A is disposed at the other side of the CNT array sheet 3 relative to the first substrate 51 (the other side in thickness direction). The head portion 55A has a circular shape in plan view. The head portion 55A has an external diameter larger than the diameter of the openings 51A.

The body portion 55B is a portion between the head portion 55A and the crimp portion 55C in the rivet 55. The body portion 55B has a cylinder shape extending in the thickness direction. The body portion 55B is inserted in the openings 51A of the first substrate 51, and inserted in the openings 53A of the second substrate 53. The body portion 55B has an external diameter that is substantially the same as the diameter of the openings 51A (slightly smaller diameter).

The crimp portion 55C is provided at one end portion of the rivet 55 in the thickness direction. The crimp portion 55C is disposed at the opposite side of the CNT array sheet 3 relative to the second substrate 53 (one side in thickness direction). The crimp portion 55C has a circular shape in plan view. The crimp portion 55C has an external diameter that is larger than the diameter of the openings 53A.

Such a CNT composite material 70 has an electric resistance (conductive resistance) in the thickness direction in the range of, for example, the same as the electric resistance range in the thickness direction of the CNT composite material 50. The CNT composite material 70 has a thermal conductivity in the thickness direction in the range of, for example, the same as the thermal conductivity range in the thickness direction of the above-described CNT composite material 50.

Such a CNT composite material 70 can be used similarly in application of the above-described CNT composite material 50, but preferably used as a vibration isolator. That is, the vibration isolator includes the CNT composite material 70, and preferably consists of the CNT composite material 70.

In the vibration isolator including the CNT composite material 70, the CNT array sheet 3 is firmly adhered to the first substrate 51 with the first adhesion layer 52, and adhered to the second substrate 53 with the second adhesion layer 54, and therefore when vibration is applied from outside in the thickness direction to the CNT composite material 70, the vibration is propagated to the CNT array sheet 3 through the first substrate 51 and/or second substrate 53.

Then, the plurality of CNTs 6 included in the CNT array sheet 3 go through expansion and contraction in alignment direction by vibration energy. At this time, air is present between the plurality of CNTs 6, and therefore expansion and contraction energy (kinetic energy) of the CNT 6 is converted to thermal energy. In this manner, vibration from outside can be efficiently reduced.

(2) Method for Producing CNT Composite Material 70

Figure 15A:
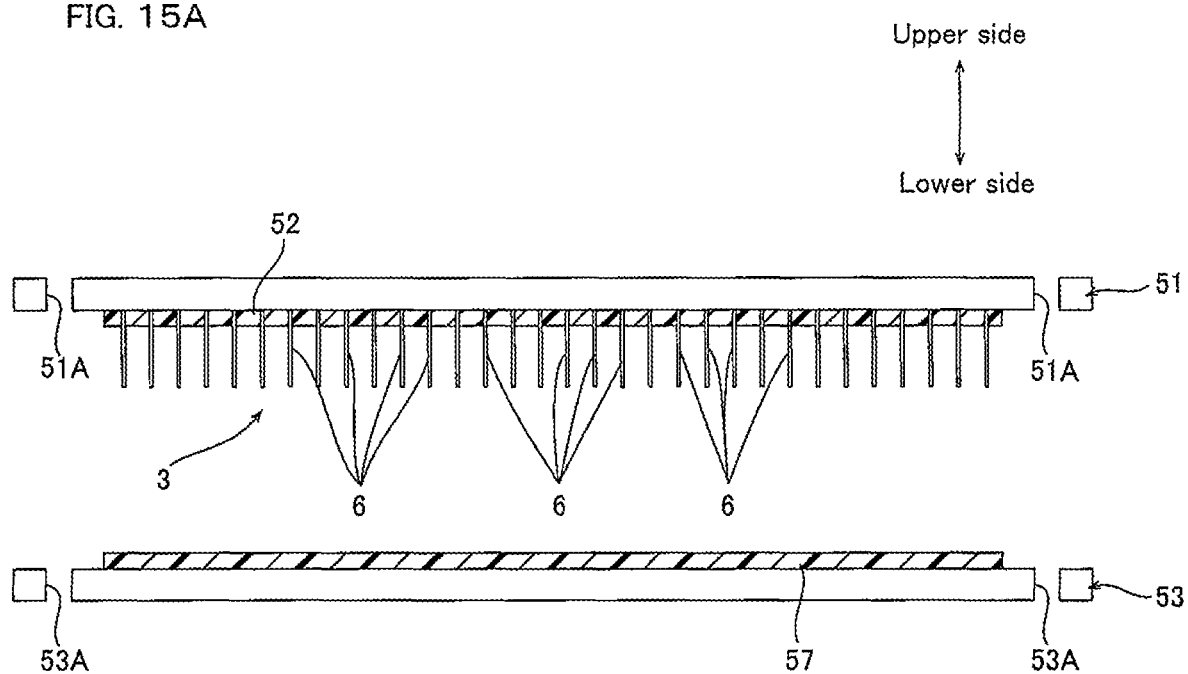
FIG. 15A illustrates a method for producing the CNT composite material of the second invention in a sixth embodiment, showing a step of embedding the CNT array sheet in a second resin composition layer. Following FIG. 15A.
Figure 15B:
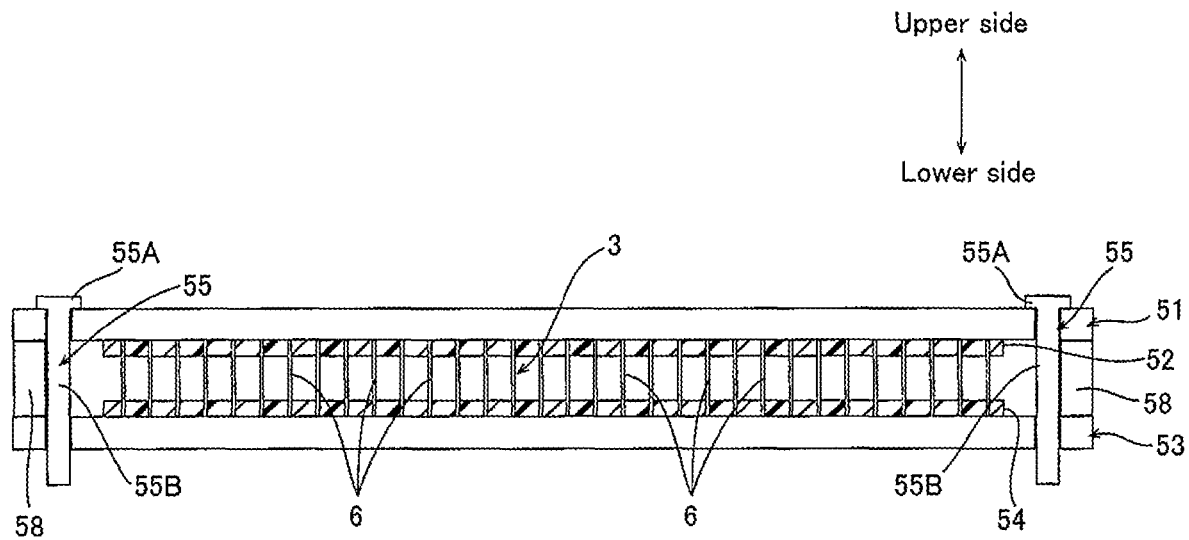
FIG. 15B illustrates a step of curing the second resin composition layer to form a second adhesion layer.

Next, description is given as to the method for producing a CNT composite material 70 with reference to FIG. 15A and FIG. 15B.

First, as shown in FIG. 12A to FIG. 12C, in the same manner as in the fifth embodiment, the CNT array sheet 3 is allowed to adhere to the first substrate 51 with the first adhesion layer 52.

As shown in FIG. 15A, the second substrate 53 is prepared. Then, as necessary, the upper face of the second substrate 53 is subjected to surface treatment with, for example, UV irradiation and surface abrasion.

Then, when the second adhesion layer 54 is formed from thermosetting resin, on the second substrate 53, to be specific, on the upper face of the second substrate 53, an A-stage or B-stage second resin composition layer 57 composed of thermosetting resin composition is formed.

The second resin composition layer 57 is formed on the upper face of the second substrate 53 by, for example, in the same manner as in the method for forming the resin composition layer 56 (hereinafter referred to as first resin composition layer 56) on the upper face of the first substrate 51. The thickness range of the second resin composition layer 57 is the same as the thickness range of the first resin composition layer 56.

Then, as shown in FIG. 15A, the first substrate 51 to which the CNT array sheet 3 is adhered is disposed upside down, i.e., the CNT array sheet 3 is at the lower side and the first substrate 51 is at the upper side. Then, the CNT array sheet 3 is faced to the second resin composition layer 57 at the upper side in spaced apart relation.

Then, as shown in FIG. 15A and FIG. 15B, the first substrate 51 to which the CNT array sheet 3 is adhered is descended, and the CNT array sheet 3 is embedded in the second resin composition layer 57 so that the second substrate 53 is positioned opposite to the first substrate 51 relative to the CNT array sheet 3.

The temperature range for embedding the CNT array sheet 3 to the second resin composition layer 57 is, the same as the temperature range for embedding the VACNTs 19 to the first resin composition layer 56.

At this time, between the first substrate 51 and the second substrate 53, preferably, a spacer 58 as an example of the fixing member (second fixing member) is provided. That is, the sixth embodiment further includes a step of providing the spacer 58.

To be specific, the spacer 58 fixes the first substrate 51 and the second substrate 53 so as to keep the distance between the first substrate 51 and the second substrate 53, and is interposed between the peripheral end portion of the first substrate 51 and the peripheral end portion of the second substrate 53. The spacer 58 is provided at a position that does not overlap with the openings 51A and the openings 53A when projected in up-down direction. The number of the spacer 58 is not particularly limited, but preferably, two or more. In this manner, the space between the first substrate 51 and the second substrate 53 can be secured precisely.

Then, the second resin composition layer 57 is heated and cured.

The heating temperature range of the second resin composition layer 57 is the same as the heating temperature range of the first resin composition layer 56. The heating time range of the second resin composition layer 57 is the same as the heating time range of the first resin composition layer 56.

In the step of curing the second resin composition layer 57, preferably, the CNT array sheet 3 is pressed toward the lower side so that the CNT array sheet 3 faces the second substrate 53 with the above-described pressure.

In the sixth embodiment, when the second resin composition layer 57 is cured, the second resin composition layer 57 is positioned at the upper side relative to the second substrate 53, and the CNT array sheet 3 is embedded from the upper side relative to the second resin composition layer 57. Therefore, the second resin composition layer 57 is in close contact with the second substrate 53 with its own weight. As a result, the second resin composition layer 57 can be suppressed from being separated from the second substrate 53, and contact failure between the CNT array sheet 3 and the second substrate 53 can be suppressed.

In the above-described manner, the second resin composition layer 57 is completely cured to be a second adhesion layer 54 that allows the CNT array sheet 3 to adhere to the second substrate 53.

When the second adhesion layer 54 is formed from thermoplastic resin (particularly fluorine polymer), in the same manner as in the method for forming the first adhesion layer 52 on the first substrate 51, the second adhesion layer 54 formed from thermoplastic resin (particularly fluorine polymer) is formed on the second substrate 53.

Then, the second adhesion layer 54 is heated to melt the second adhesion layer 54. The heating temperature range of the second adhesion layer 54 is the same as the heating temperature of the above-described first adhesion layer 52.

Then, in the same manner as in the above, the CNT array sheet 3 is embedded in the second adhesion layer 54 so that the second substrate 53 is positioned opposite to the first substrate 51 relative to the CNT array sheet 3. Thereafter, cooling is conducted to harden the melted state second adhesion layer 54 while being in close contact with the second substrate 53 and the CNT array sheet 3. In this manner, the second adhesion layer 54 allows the CNT array sheet 3 to adhere to the second substrate 53.

Thereafter, as shown in FIG. 15B, the first substrate 51 and the second substrate 53 are fixed with a plurality of rivets 55. That is, the sixth embodiment further includes a step of providing the rivets 55.

The rivets 55 before fixing the first substrate 51 and the second substrate 53 consist of the head portion 55A and the body portion 55B. Then, the body portion 55B of the rivet 55 is inserted in the openings 51A and the openings 53A from the upper side. At this time, the free end portion of the body portion 55B (opposite-side end portion of the head portion 55A) is projected at the lower side than the second substrate 53. Thereafter, as shown in FIG. 13, the free end portion of the body portion 55B is crimped to form the crimp portion 55C.

In the above-described manner, the CNT composite material 50 is produced.

(3) Operations and Effects

As shown in FIG. 13, the CNT composite material 70 further include a second substrate 53 disposed opposite to the first substrate 51 relative to the CNT array sheet 3, and a second adhesion layer 54 that allows the CNT array sheet 3 to adhere to the second substrate 53.

Therefore, a structure in which the CNT array sheet 3 is disposed between the first substrate 51 and the second substrate 53 can be achieved.

When the second adhesion layer 54 is formed from thermosetting resin, as shown in FIG. 15A and FIG. 15B, on the second substrate 53, the A-stage or B-stage second resin composition layer 57 composed of thermosetting resin composition is formed, and thereafter the CNT array sheet 3 is embedded in the second resin composition layer 57 so as to be brought into contact with the second substrate 53, and the second resin composition layer 57 is heated and cured, thereby allowing the CNT array sheet 3 to adhere to the second substrate 53.

Therefore, disorganized alignment of the CNT array sheet 3 can be suppressed, and contact between the CNT array sheet 3 and the second substrate 53 can be stably secured. As a result, the CNT array sheet 3 can be positioned between the first substrate 51 and the second substrate 53, and contact between the CNT array sheet 3 and the first substrate 51 and second substrate 53 can be stably secured.

When the second adhesion layer 54 is formed from fluorine polymer, the CNT array sheet 3 can be allowed to adhere to the second substrate 53 stably, and heat resistance, oil resistance, and chemical resistance of the second adhesion layer 54 can be improved.

As shown in FIG. 13, the rivets 55 fix the first substrate 51 and the second substrate 53. Therefore, when a force is applied to the CNT composite material 70 from outside, deformation of the CNT composite material 70 can be suppressed. The rivets 55 can suppress the movement and separation of the first substrate 51 and the second substrate 53 from each other to the outside in the thickness direction. As a result, the state of the CNT array sheet 3 being embedded in the first adhesion layer 52 and the second adhesion layer 54 can be stably kept.

As shown in FIG. 15B, the CNT composite material 70 is provided with spacers 58. The spacers 58 can suppress the first substrate 51 and the second substrate 53 to move close to each other to the inner side in the thickness direction. Therefore, the space between the first substrate 51 and the second substrate 53 can be precisely secured.

As a result, the rivet 55 and the spacer 58 can keep the distance between the first substrate 51 and the second substrate 53. In this manner, the state of the CNT array sheet 3 embedded in the first adhesion layer 52 and the second adhesion layer 54 can be stably kept.

As shown in FIG. 13, the CNT composite material 70 can be suitably used as a vibration isolator. In the CNT composite material 70, the CNT array sheet 3 is allowed to adhere to the first substrate 51 with the first adhesion layer 52, and to the second substrate 53 with the second adhesion layer 54.

Therefore, when vibration is applied to the CNT composite material 70 from outside in the thickness direction, the vibration is propagated to the CNT array sheet 3 through the first substrate 51 and/or second substrate 53.

Then, the plurality of CNTs 6 included in the CNT array sheet 3 go through expansion and contraction by vibration energy in alignment direction (thickness direction). At this time, air is present between the plurality of CNTs 6, and therefore expansion and contraction energy (kinetic energy) of the CNT 6 can be converted to thermal energy by friction with air. As a result, vibration from outside can be reduced efficiently.

Such a sixth embodiment also achieves the same operations and effects as those of the fifth embodiment.

Seventh Embodiment

Figure 16:
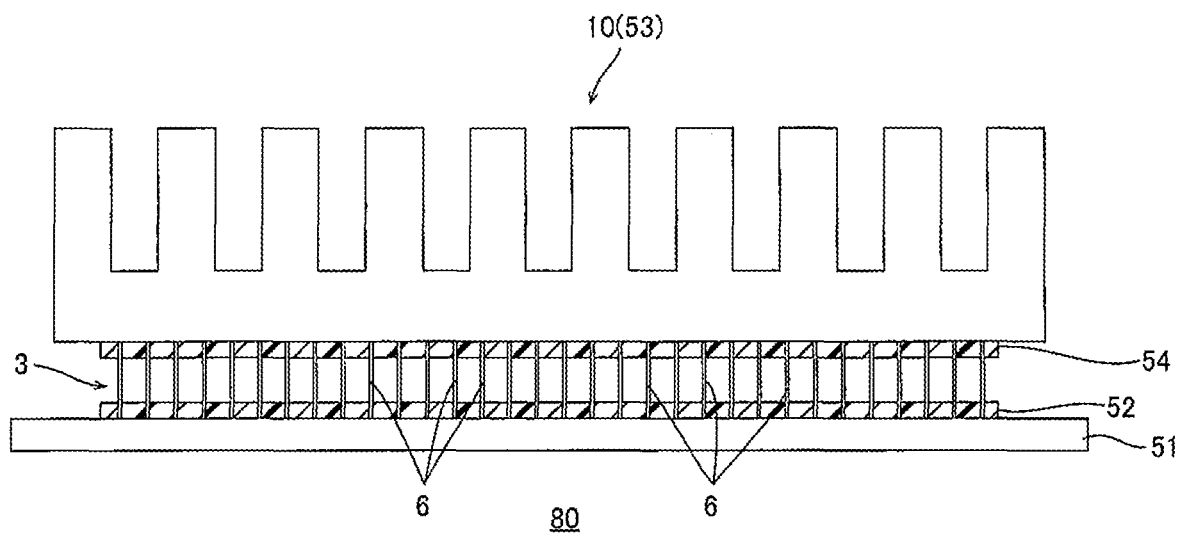
FIG. 16 is a side view of the CNT composite material of the second invention in a seventh embodiment.

Next, description is given as to the seventh embodiment of the second invention with reference to FIG. 16. In the seventh embodiment, the same reference numerals are given to those members that are the same as those in the above-described fifth embodiment and sixth embodiment, and description thereof is omitted.

In the sixth embodiment, as shown in as shown in FIG. 13, the first substrate 51 and the second substrate 53 have a sheet shape, but the shape of the first substrate 51 and the second substrate 53 is not particularly limited.

In the seventh embodiment, as shown in as shown in FIG. 16, the second substrate 53 is the above-described heat release member 10. To be specific, the CNT composite material 80 includes a CNT array sheet 3, a first substrate 51, a first adhesion layer 52, a heat release member 10, and a second adhesion layer 54. Then, the second adhesion layer 54 allows the CNT array sheet 3 to adhere to the heat release member 10.

The CNT composite material 80 include the first substrate 51 and the first adhesion layer 52, but it is not limited thereto, and the CNT composite material 80 may not include the first substrate 51 and the first adhesion layer 52.

Eighth Embodiment

Figure 17A:
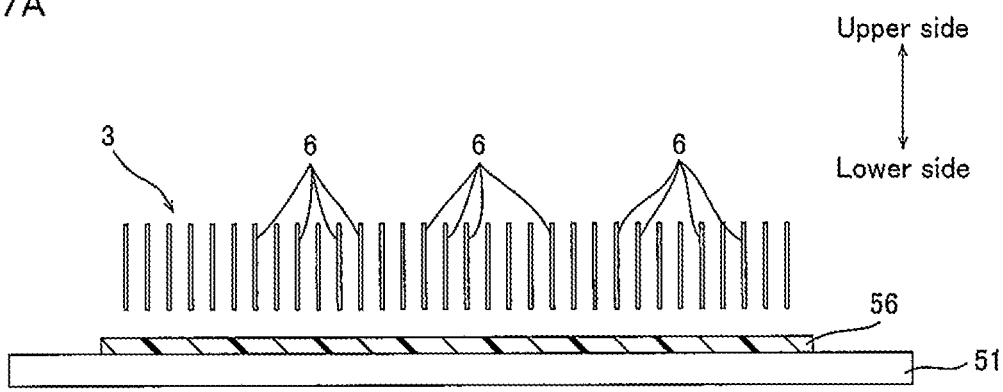
FIG. 17A illustrates a method for producing the CNT composite material of the second invention in an eighth embodiment, showing a step of embedding the CNT array sheet in the first resin composition layer. Following FIG. 17A.
Figure 17B:
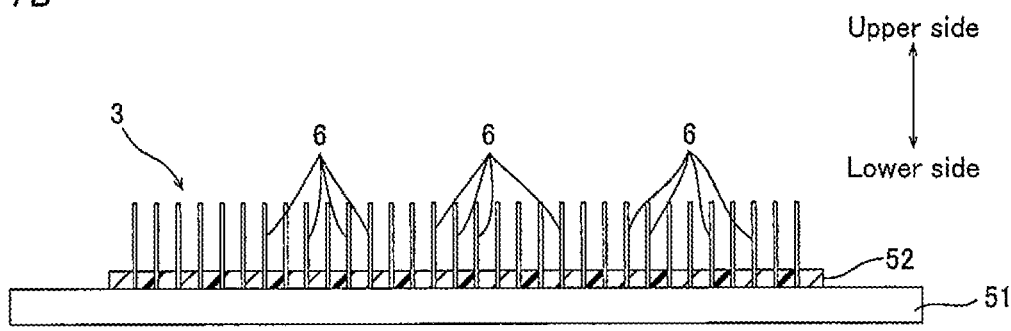
FIG. 17B illustrates a step of curing the first resin composition layer to form a first adhesion layer.

Next, description is given as to the eighth embodiment of the second invention with reference to FIG. 17A and FIG. 17B. In the eighth embodiment, the same reference numerals are given to those members that are the same as those in the above-described fifth embodiment, and description thereof is omitted.

In the fifth embodiment, as shown in FIG. 12A to FIG. 12C, the VACNTs 19 grown in the growth substrate 15 are not removed from the growth substrate 15, and embedded in the resin composition layer 56 (or adhesion layer 52 formed from thermoplastic resin) but it is not limited thereto.

In the eighth embodiment, as shown in FIG. 17A and FIG. 17B, the CNT array sheet 3 removed from the growth substrate 15 is embedded in the resin composition layer 56 (or adhesion layer 52 formed from thermoplastic resin).

In the eighth embodiment, as shown in FIG. 2A to FIG. 2C, the VACNTs 19 is allowed to grow on the growth substrate 15, and thereafter as shown in FIG. 3A and FIG. 3B, the VACNTs 19 are removed from the growth substrate 15 to form the CNT array sheet 3.

Thereafter, the CNT array sheet 3 is subjected to the above-described densifying, preferably, heating, as shown in FIG. 4A and FIG. 4B. That is, the eighth embodiment further includes a step of removing the VACNTs 19 from the growth substrate 15 to form the CNT array sheet 3, and a step of densifying the CNT array sheet 3.

Thereafter, as shown in FIG. 17A and FIG. 17B, the densified CNT array sheet 3 is embedded in the resin composition layer 56 (or adhesion layer 52 formed from thermoplastic resin) on the first substrate 51 in the same manner as described above. Then, the resin composition layer 56 is heated and cured in the same manner as in the above, to form the first adhesion layer 52 that allows the CNT array sheet 3 to adhere to the first substrate 51. In this manner, the CNT composite material 90 can be produced.

With the eighth embodiment, the CNT array sheet 3 is removed from the growth substrate 15 to form the CNT array sheet 3, and thereafter densified, and therefore characteristics of the CNT array sheet 3 (for example, thermal conductivity, etc.) can be improved, and also performance of the CNT composite material 90 can be improved. With the eighth embodiment also achieves the operations and effects of the fifth embodiment.

Ninth Embodiment

Figure 18A:
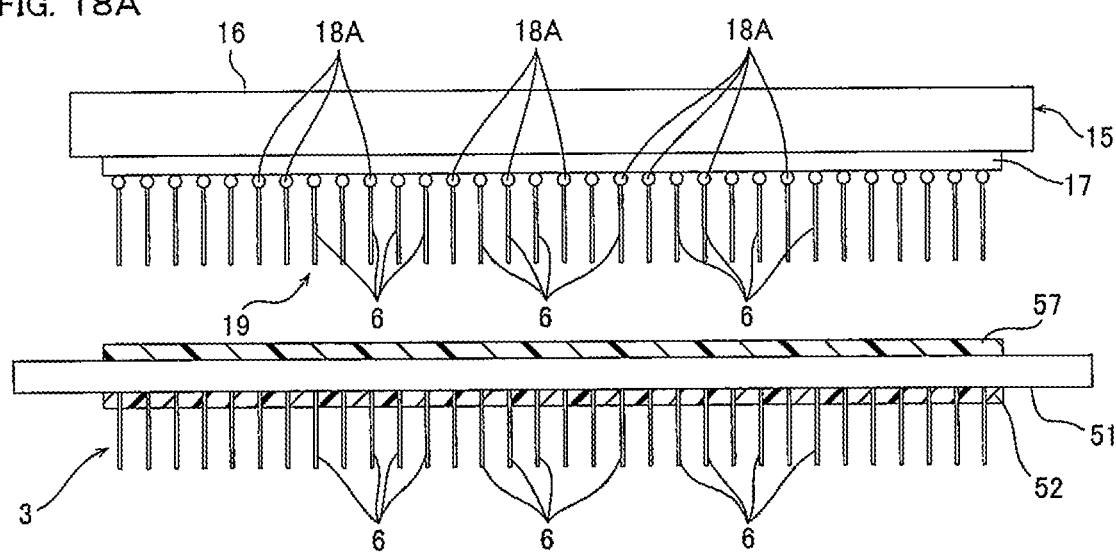
FIG. 18A illustrates a method for producing the CNT composite material of the second invention in a ninth embodiment, showing a step of embedding the VACNTs in the second resin composition layer. Following FIG. 18A.

Next, description is given as to the ninth embodiment of the second invention with reference to FIG. 18A and FIG.

18B. In the ninth embodiment, the same reference numerals are given to those members that are the same as those in the above-described fifth embodiment, and description thereof is omitted.

In the fifth embodiment, as shown in as shown in FIG. 11, the CNT array sheet 3 is disposed only on one side of the first substrate 51 in the thickness direction, but it is not limited thereto.

In the ninth embodiment, in the same manner as in the first invention, the CNT array sheet 3 is disposed on both sides of the first substrate 51 in the thickness direction.

In the ninth embodiment, as shown in FIG. 13C, in the same manner as described above, the first substrate 51, in which the CNT array sheet 3 is adhered with the first adhesion layer 52 is prepared.

Then, as shown in FIG. 18A, on the opposite side of the first adhesion layer 52 in the first substrate 51, in the same manner as described above, the second resin composition layer 57 is formed.

Then, the growth substrate 15 on which the VACNTs 19 grow is prepared, and the VACNTs 19 is embedded in the second resin composition layer 57 so as to be in contact with the first substrate 51.

Figure 18B:
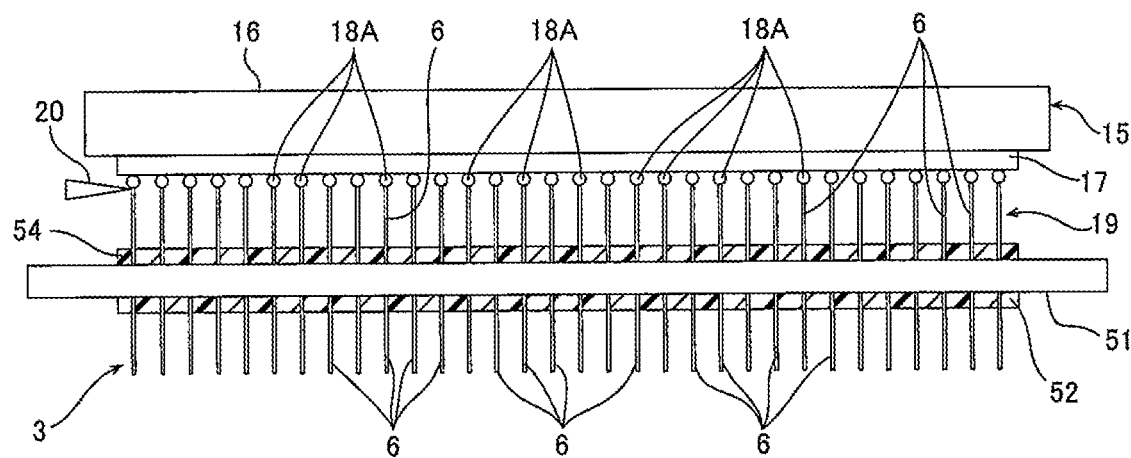
FIG. 18B illustrates a step of curing the second resin composition layer to form a second adhesion layer.

Then, as shown in FIG. 18B, the second resin composition layer 57 is heated and cured in the same manner as in the above to form the second adhesion layer 54.

Then, in the same manner as described above, the growth substrate 15 is removed from the VACNTs 19. In this manner, the CNT array sheet 3 is formed from the VACNTs 19.

Figure 18C:
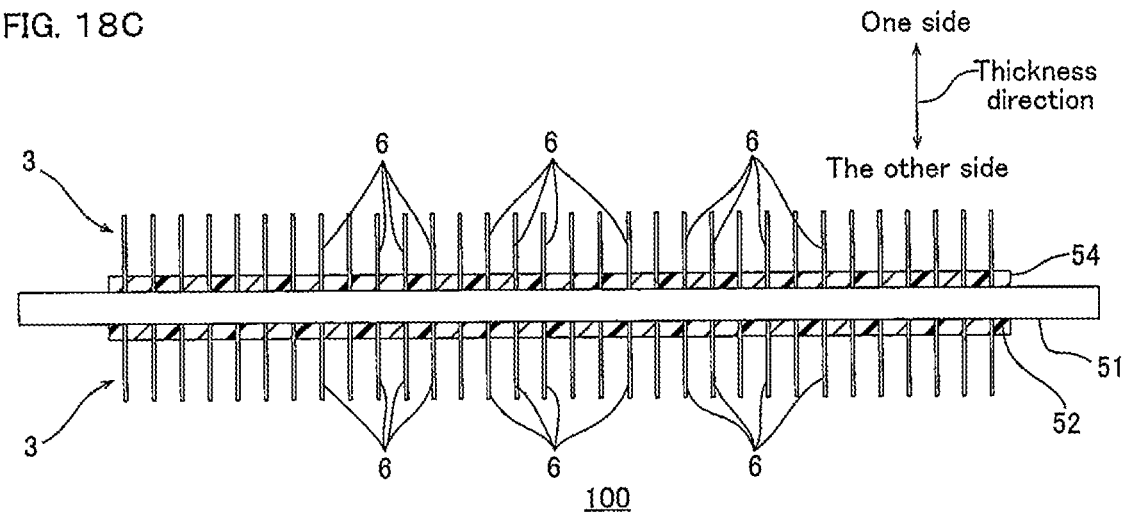
FIG. 18C illustrates a step of, following FIG. 18B, removing the growth substrate from the VACNTs.

In the above-described manner, as shown in FIG. 18C, the CNT composite material 100 is produced.

The CNT composite material 100 includes a first substrate 51; two CNT array sheets 3 disposed on both sides of the first substrate 51 in the thickness direction (one side and the other side); a first adhesion layer 52 that allows the CNT array sheet 3 to adhere to the first substrate 51 so that the CNT array sheet 3 is brought into contact with the other side of the first substrate 51 in the thickness direction; and a second adhesion layer 54 that allows the CNT array sheet 3 to adhere to the first substrate 51 so that the CNT array sheet 3 is brought into contact with one side of the first substrate 51 in the thickness direction.

The CNT composite material 100 is an example of the thermal conductive sheet in the first invention, and the first substrate 51, first adhesion layer 52, and second adhesion layer 54 configures an example of the fixture sheet of the first invention. The two CNT array sheets 3 are embedded in both front and back sides of the fixture sheet.

The first substrate 51 is an example of the substrate in the first invention, and the first adhesion layer 52 and the second adhesion layer 54 are an example of the resin layer disposed on both front and back sides of the substrate in the first invention. Then, the first substrate 51-side end portion of the CNT array sheet 3 is embedded in the corresponding resin layer and in contact with the first substrate 51.

Such a ninth embodiment also achieves the same operations and effects of the fifth embodiment.

Modified Example

In the fifth embodiment, as shown in FIG. 12B, the VACNTs 19 are embedded in the resin composition layer 56, and after the resin composition layer 56 is heated and cured, the growth substrate 15 is removed from the VACNTs 19, but it is not limited thereto. After the VACNTs 19 is embedded in the resin composition layer 56, and before the resin composition layer 56 is heated and cured, the growth substrate 15 can be removed from the VACNTs 19.

In the fifth embodiment, when the resin composition layer 56 is cured, the resin composition layer 56 is positioned at the upper side relative to the first substrate 51, but it is not limited thereto. The resin composition layer 56 can be positioned at the lower side relative to the first substrate 51 when it is cured.

In the sixth embodiment, as shown in FIG. 13, a plurality of rivets 55 are included, but it is not limited thereto. The CNT composite material 50 does not have to include the plurality of rivets 55.

In the sixth embodiment, as shown in FIG. 15B, the spacer 58 is provided between the first substrate 51 and the second substrate 53, but it is not limited thereto. The spacer 58 does not have to be provided between the first substrate 51 and the second substrate 53.

In the sixth embodiment, the first resin composition layer 56 in which the VACNTs 19 was embedded was heated and cured to form the first adhesion layer 52, and thereafter the VACNTs 19 (CNT array sheet 3) is embedded in the second resin composition layer 57, and the second resin composition layer 57 is heated and cured to form the second adhesion layer 54, but it is not limited thereto.

For example, the CNT array sheet 3 is embedded in the first resin composition layer 56 and the second resin composition layer 57, and thereafter the first resin composition layer 56 and the second resin composition layer 57 are collectively heated to form the first adhesion layer 52 and the second adhesion layer 54.

In the sixth embodiment, when the second resin composition layer 57 is cured, the second resin composition layer 57 is positioned at the upper side relative to the second substrate 53, but it is not limited thereto. The second resin composition layer 57 can be positioned at the lower side relative to the second substrate 53 when it is heated.

In the fifth embodiment and the sixth embodiment, as shown in FIGS. 11 and 13, the CNT array sheet 3 is preferably in contact with the first substrate 51 and the second substrate 53, but it is not limited thereto, and the CNT array sheet 3 does not have to be brought into contact with the first substrate 51 and the second substrate 53. In this case, the first adhesion layer 52 and the second adhesion layer 54 preferably contains the above-described additive. By allowing the CNT array sheet 3 and the additive to be brought into contact with each other in the first adhesion layer 52 and the second adhesion layer 54, electrically non-conductive and thermal conductivity of the CNT composite material can be secured.

These fifth embodiment to ninth embodiment, and modified example can be suitably combined.

EXAMPLES

The present invention is further described in detail based on EXAMPLES below. But the present invention is not limited to these Examples. The specific numerical values of mixing ratio (content), physical property value, and parameter used in the description below can be replaced with the upper limit values (numerical values defined with "or less" or "below") or lower limit values (numerical values defined with "or more" or "more than") of the corresponding numerical values of mixing ratio (content), physical property value, and parameter described in "DESCRIPTION OF EMBODIMENTS" above.

Example 1

A silicon dioxide film was stacked on the surface of the stainless steel-made growth substrate (stainless steel substrate), and thereafter iron was vapor deposited as a catalyst layer on the silicon dioxide film.

Then, the growth substrate was heated to a predetermined temperature, and a source gas (acetylene gas) was supplied to the catalyst layer. In this manner, the VACNTs having a rectangular shape in plan view was formed on the growth substrate.

In the VACNTs, the plurality of CNTs extend in substantially parallel to each other, and aligned (vertical alignment) orthogonal to the growth substrate. The CNT is a multi-walled carbon nanotube, has an average external diameter of about 12 nm, and has an average length of about 80 μm. The VACNTs have a bulk density of about 50 mg/cm$^3$.

Then, the cutter blade (cutting blade) was shifted along the growth substrate, and the VACNTs was cut out from the growth substrate to prepare the CNT array sheet.

Then, the CNT array sheet was accommodated in a heat resistant carbon vessel, and the carbon vessel was disposed in a resistance heating furnace.

Then, inside the resistance heating furnace was replaced with an argon atmosphere, and thereafter the temperature was increased at 10° C./min to 2800° C., and kept at 2800° C. for 2 hours. In this manner, the CNT array sheet was densified, and thereafter cooled naturally to room temperature.

The densified CNT array sheet had a bulk density of about 100 mg/cm$^3$, and the CNT array sheet had an electric resistance (conductive resistance) in the thickness direction at 25° C. of 0.1Ω, and the CNT array sheet had a thermal conductivity in the thickness direction of about 30 W/(m·K).

Then, in the same manner as described above, two densified CNT array sheets were prepared.

Then, a copper sheet (substrate) having a thickness of 100 μm was prepared, and two resin sheet having a thickness of about 30 μm and formed from PTFE were prepared.

Then, the resin sheet was disposed on both front and back sides of the copper sheet, thereby preparing a fixture sheet.

Then, the above-described CNT array sheets were disposed on both front and back sides of the resin sheet. A pressure of 0.8 MPa was applied from outside in the thickness direction so that the two CNT array sheets face the copper sheet, and heated at 380° C. for 5 minutes.

Thereafter, cooling was conducted, thereby producing a thermal conductive sheet.

Example 2

A paste was prepared by dispersing titanium particles (metal particles) in a PVA solution (resin solution, PVA concentration: 10 mass %) in which PVA was dissolved in water (solvent).

The titanium particles had an average primary particle size of 2 to 3 μm, and the titanium particle content relative to the paste as a whole was 20 mass %.

Then, of the two CNT array sheets prepared in the same manner as in Example 1, the paste was applied to one of the CNT array sheet to form a particle-containing layer having a thickness of about 30 μm. Then, the other CNT array sheet was disposed on the particle-containing layer so that the particle-containing layer was sandwiched between the two CNT array sheets.

Thereafter, a pressure of 0.8 MPa was applied to the particle-containing layer on which the CNT array sheet was disposed in an inert gas atmosphere while the two CNT array sheets were brought closer to each other from outside in the thickness direction, and heating was conducted at about 1700° C. for 5 minutes.

Thereafter, cooling was conducted, thereby producing a thermal conductive sheet.

Example 3

A resin sheet (fixture sheet) having a thickness of 30 μm and formed from PFA was prepared.

Then, the CNT array sheets prepared in the same manner as in Example 1 were disposed on both front and back sides of the resin sheet.

Thereafter, a pressure of 0.8 MPa was applied to the resin sheet on which the CNT array sheet was disposed so that the two CNT array sheets were brought closer from outside in the thickness direction, and heating was conducted at about 380° C. for 5 minutes.

Thereafter, cooling was conducted, thereby producing a thermal conductive sheet.

Comparative Example 1

A silicon dioxide film was stacked on both front and back sides of a stainless steel-made growth substrate, and thereafter iron was vapor deposited as a catalyst layer on a silicon dioxide film.

Then, the growth substrate was heated to a predetermined temperature, and a source gas (acetylene gas) was supplied to the catalyst layer. In this manner, VACNTs having a rectangular shape in plan view were formed on both front and back sides of the substrate. In the VACNTs, the CNT had an average external diameter, an average length, and a bulk density that are the same as those of Example 1.

Then, the growth substrate on which VACNTs were disposed on both sides thereof was used as a thermal conductive sheet.

<Evaluation>

(1) Thermal Conductivity

The thermal conductive sheet produced in Examples and Comparative Examples was subjected to measurement of thermal resistance with a thermal resistance measurement device (trade name: T3Ster DynTIM Tester, manufactured by Mentor Graphics Corp.). Then, the thickness of the thermal conductive sheet was changed, and the thermal resistance was measured at several points (for example, 3 points), and the thermal conductive sheet thickness and the measured thermal resistance were plotted. Based on the plotting, thermal conductivity of the thermal conductive sheet was calculated. The results are shown in Table 1.

(2) Electric Resistance

The thermal conductive sheet produced in Examples and Comparative Examples was subjected to measurement of electric resistance in thickness direction with an electric resistance measurement device (trade name: resistivity chamber, manufactured by ADC CORPORATION). The results are shown in Table 1.

(3) Adhesive Strength Test

A pressure sensitive adhesive tape was bonded to the CNT array sheet from the opposite side from the fixture sheet in the thermal conductive sheet produced in Examples, and thereafter the pressure sensitive adhesive tape was removed.

A pressure sensitive adhesive tape was bonded to the VACNTs from the opposite side from the growth substrate in the thermal conductive sheet produced in Comparative Example, and thereafter the pressure sensitive adhesive tape was removed.

Then, the adhesive strength was evaluated based on the following criteria. The results are shown in Table 1.

GOOD: obvious separation of the CNT array sheet (VACNTs) from the fixture sheet (growth substrate) was not seen.

BAD: obvious separation of the CNT array sheet (VACNTs) from the fixture sheet (growth substrate) was seen.

TABLE 1

| | no. | | | |
|---|---|---|---|---|
| | Example 1 | Example 2 | Example 3 | Comparative example 1 |
| Thermal conductivity [W/(m · K)] | 60 | 30 | 20 | 6 |
| Electric resistance in thickness direction [Ω] | 1 | 3 | 10 | $10^6$ |
| Adhesive strength | GOOD | GOOD | GOOD | BAD |

Example 4

VACNTs were grown on the growth substrate in the same manner as in Example 1.

Then, aluminum foil having a thickness of 10 μm was prepared as a first substrate, and the surface of the first substrate (aluminum foil) was subjected to surface treatment with UV irradiation.

Then, an epoxy resin-based prepreg sheet (thickness 30μm) was bonded to the surface (upper face) of the first substrate, thereby preparing a first resin composition layer. The first resin composition layer was formed from a B-stage epoxy resin composition.

Then, the growth substrate on which VACNTs were grown was disposed so that the VACNTs were at the lower side and the growth substrate was at the upper side. Then, the VACNTs were disposed at the upper side relative to the first resin composition layer to as to face in spaced apart relation.

Then, without removing the growth substrate, at 55° C., the VACNTs were embedded in the first resin composition layer so that the VACNTs were brought into contact with the first substrate.

Then, the VACNTs was heated while applying a pressure of 4 kPa facing the first substrate, at 160° C. (first resin composition layer heating temperature) for 1 hour.

In this manner, the first resin composition layer was completely cured (C stage) while the VACNTs were brought into contact with the first substrate, thereby forming a first adhesion layer. The first adhesion layer is composed of the completely cured (C stage) epoxy resin, and allowed the VACNTs to adhere to the first substrate. Thereafter, the growth substrate was removed from the VACNTs. In this manner, the VACNTs was formed into a CNT array sheet.

Then, the aluminum foil as described above was prepared as a second substrate, and on the surface of the second substrate, a separately prepared epoxy resin-based prepreg sheet was bonded, thereby forming a second resin composition layer. The second resin composition layer was formed from the B-stage epoxy resin composition.

Then, the first substrate to which the CNT array sheet was bonded was flipped upside down to that the CNT array sheet was at the lower side and the first substrate was at the upper side, thereby disposing the CNT array sheet at the upper side relative to and facing the second resin composition layer in spaced apart relation.

Then, the CNT array sheet was embedded in the second resin composition layer so as to be brought into contact the second substrate.

Then, a pressure of 4 kPa was applied so that the CNT array sheet faced the second substrate, and heating was conducted at 160° C. for 1 hour.

In this manner, the second resin composition layer was completely cured (C stage) while the CNT array sheet was brought into contact with the second substrate, thereby forming a second adhesion layer. The second adhesion layer was composed of the completely cured (C stage) epoxy resin, and allowed the CNT array sheet to adhere to the second substrate.

In the above-described manner, the CNT composite material was produced.

Example 5

A CNT composite material was produced in the same manner as in Example 4, except that a varnish composed of an epoxy resin composition was applied on a first substrate to form a first resin composition layer, the curing temperature of the first resin composition layer was changed to 110° C., a varnish composed of an epoxy resin composition was applied to a second substrate to form a second resin composition layer, and the curing temperature of the second resin composition layer was changed to 110° C. The first resin composition layer and the second resin composition layer were formed from an A-stage epoxy resin composition.

Example 6

A CNT composite material was produced in the same manner as in Example 4, except that a varnish composed of fluorine rubber composition (N-methylpyrrolidone solution) was applied on a first substrate to form a first resin composition layer, the curing temperature of the first resin composition layer was changed to 200° C., a varnish composed of fluorine rubber composition (N-methylpyrrolidone solution) was applied to a second substrate to form a second resin composition layer, and the curing temperature of the second resin composition layer was changed to 200° C. The first resin composition layer and the second resin composition layer were formed from an A-stage fluorine rubber composition.

Examples 7 to 9

A plurality of (4) rivets were further provided on the CNT composite material of Examples 4 to 6.

Example 10

A first substrate in which the CNT array sheet was adhered with the first adhesion layer was prepared in the same manner as in Example 4.

Then, the first substrate to which the CNT array sheet was adhered was flipped upside down, so that the VACNTs were at the lower side and the first substrate was at the upper side.

Then, an epoxy resin-based prepreg sheet was bonded to the face of the first substrate opposite to the first adhesion layer, thereby forming a second resin composition layer. The second resin composition layer was formed from a B-stage epoxy resin composition.

Then, separately, the VACNTs was allowed to grow on the growth substrate, and thereafter at 55° C., the VACNTs were embedded in the second resin composition layer so that the VACNTs on the growth substrate were brought into contact with the first substrate.

Then, a pressure of 4 kPa was applied while the VACNTs were facing the first substrate, and heating was conducted at 160° C. for 1 hour.

In this manner, the second resin composition layer was completely cured (C stage) while the VACNTs were brought into contact with the first substrate, thereby forming a second adhesion layer (second resin layer). The second adhesion layer (second resin layer) was composed of the completely cured (C stage) epoxy resin, and allowed the VACNTs to adhere to the first substrate.

In the above-described manner, a CNT composite material(thermal conductive sheet) was produced. The CNT composite material (thermal conductive sheet) included a first substrate (substrate), a fixture sheet including a first adhesion layer (first resin layer) and a second adhesion layer (second resin layer) disposed on both front and back sides of the first substrate (substrate), a CNT array sheet removed from the growth substrate and embedded in both front and back sides of the fixture sheet, and the first substrate-side end portion of the CNT array sheet is embedded in the corresponding resin layer, to be brought into contact with the first substrate side.

Example 11

A CNT composite material (thermal conductive sheet) was produced in the same manner as in Example 10, except that a varnish composed of an epoxy resin composition was applied on a first substrate to form a first resin composition layer, the curing temperature of the first resin composition layer was changed to 110° C., and a varnish composed of an epoxy resin composition was applied to the back face of the first substrate to form a second resin composition layer, and the curing temperature of the second resin composition layer was changed to 110° C. The first resin composition layer and the second resin composition layer were formed from an A-stage epoxy resin composition.

Example 12

A CNT composite material (thermal conductive sheet) was produced in the same manner as in Example 10, except that a varnish composed of fluorine rubber composition (N-methylpyrrolidone solution) was applied on the surface of a first substrate to form a first resin composition layer, the curing temperature of the first resin composition layer was changed to 200° C., a varnish composed of fluorine rubber composition (N-methylpyrrolidone solution) was applied to the back face of the first substrate to form a second resin composition layer, and the curing temperature of the second resin composition layer was changed to 200° C. The first resin composition layer and the second resin composition layer were formed from an A-stage fluorine rubber composition.

Example 13

A CNT composite material (thermal conductive sheet) was produced in the same manner as in Example 1, except that the resin sheet (adhesion layer) formed from PTFE was disposed only on the surface of the copper sheet (substrate), and one CNT array was embedded in the resin sheet.

Example 14

A CNT composite material (thermal conductive sheet) was produced in the same manner as in Example 3, except that the resin sheet (adhesion layer) formed from PFA was disposed only on the surface of the copper sheet (substrate), and one CNT array was embedded in the resin sheet.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The CNT composite material can be applied to various industrial products, and for example, can be used as a thermal conductive material, vibration isolator, and heat insulating material. The method for producing a CNT composite material can be suitably used for production of a CNT composite material used for various industrial products.

DESCRIPTION OF REFERENCE NUMERALS 1 thermal conductive sheet
2 fixture sheet
2A front face of fixture sheet
2B back face of fixture sheet
3 CNT array sheet
4 substrate
4A front face of substrate
4B back face of substrate
5 resin layer
5A first resin layer
5B second resin layer
6 CNT
15 growth substrate
19 VACNTs
23 web stacked sheet
32 conductive layer
40 particle-containing layer
42 metal particles

The invention claimed is:
1. A method for producing a carbon nanotubes composite material, the method comprising:
allowing vertically-aligned carbon nanotubes to grow on a first growth substrate,
removing the vertically-aligned carbon nanotubes from the first growth substrate to form a first carbon nanotubes array sheet,
allowing vertically-aligned carbon nanotubes to grow on a second growth substrate,
removing the vertically-aligned carbon nanotubes from the second growth substrate to form a second carbon nanotubes array sheet,
disposing the first carbon nanotubes array sheet and the second carbon nanotubes array sheet on front and back sides, respectively, of a particle-containing layer containing metal particles,
heating the particle-containing layer to melt the metal particles to form into a fixture sheet, and
embedding the first carbon nanotubes array sheet and the second carbon nanotubes array sheet into the fixture sheet to bring into contact with each other in the fixture sheet.

* * * * *